(12) United States Patent
Fisher et al.

(10) Patent No.: US 11,536,804 B2
(45) Date of Patent: Dec. 27, 2022

(54) GLARE MITIGATION IN LIDAR APPLICATIONS

(71) Applicant: Sense Photonics, Inc., Durham, NC (US)

(72) Inventors: Brent Fisher, Bethesda, MD (US); Dietrich Dehlinger, San Francisco, CA (US)

( * ) Notice: Subject to any disclaimer, the term of this patent is extended or adjusted under 35 U.S.C. 154(b) by 622 days.

(21) Appl. No.: 16/555,556

(22) Filed: Aug. 29, 2019

(65) Prior Publication Data
US 2020/0072946 A1 Mar. 5, 2020

Related U.S. Application Data

(60) Provisional application No. 62/802,308, filed on Feb. 7, 2019, provisional application No. 62/724,322, filed on Aug. 29, 2018.

(51) Int. Cl.
| | | |
|---|---|---|
| *G01C 3/08* | (2006.01) | |
| *G01S 7/481* | (2006.01) | |
| *G01S 7/4863* | (2020.01) | |
| *G01S 7/4915* | (2020.01) | |
| *H01S 5/183* | (2006.01) | |
| *G01S 17/88* | (2006.01) | |

(52) U.S. Cl.
CPC ............ *G01S 7/481* (2013.01); *G01S 7/4863* (2013.01); *G01S 7/4915* (2013.01); *H01S 5/183* (2013.01); *G01S 17/88* (2013.01)

(58) Field of Classification Search
CPC ...... G01S 7/481; G01S 7/4863; G01S 7/4915; G01S 7/4876; G01S 17/88
See application file for complete search history.

(56) References Cited

U.S. PATENT DOCUMENTS

| | | | |
|---|---|---|---|
| 2009/0273843 A1* | 11/2009 | Raskar | H04N 5/2254 348/241 |
| 2011/0164783 A1 | 7/2011 | Hays et al. | |
| 2016/0356890 A1* | 12/2016 | Fried | G01S 7/4863 |
| 2018/0081044 A1 | 3/2018 | Sun et al. | |
| 2018/0156659 A1 | 6/2018 | Droz et al. | |
| 2018/0301872 A1 | 10/2018 | Burroughs et al. | |

FOREIGN PATENT DOCUMENTS

CN    110285788 A  *  9/2019  ......... G02B 27/0012

OTHER PUBLICATIONS

Notification of Transmittal of the International Search Report and the Written Opinion of the International Searching Authority, or the Declaration, in corresponding PCT Application No. PCT/US2019/048800 (dated Dec. 18, 2019).
Talvala et al. "Veiling Glare in High Dynamic Range Imaging" ACM Transactions on Graphics 26(3):37 (9 pages) (Jul. 2007).

* cited by examiner

*Primary Examiner* — Mark Hellner
(74) *Attorney, Agent, or Firm* — Myers Bigel, P.A.

(57) ABSTRACT

A Light Detection and Ranging (LIDAR) apparatus includes one or more optical elements configured to direct incident light in one or more directions, and a detector array including a plurality of detector pixels configured to output detection signals responsive to light provided thereto by the one or more optical elements. The light includes scattered light that is redirected relative to the one or more directions. A circuit is configured to receive the detection signals and generate corrected image data based on the detection signals and an expected spread function for the light. Related devices and methods of operation are also discussed.

19 Claims, 10 Drawing Sheets

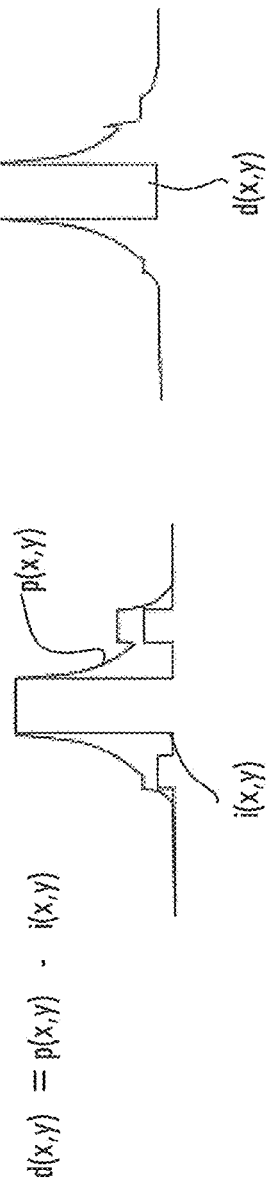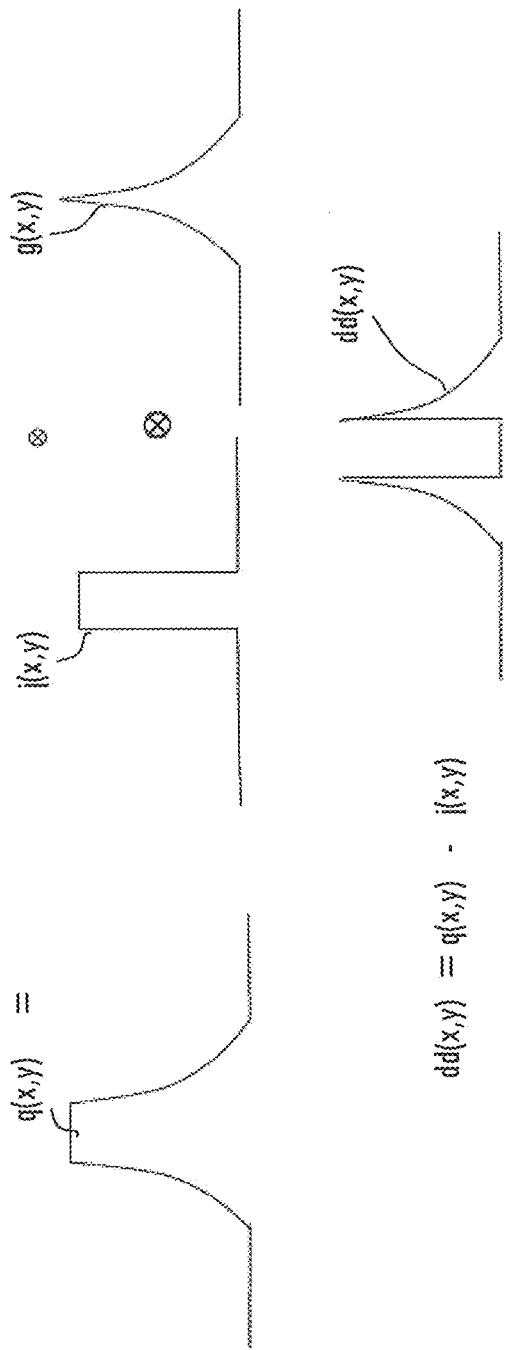

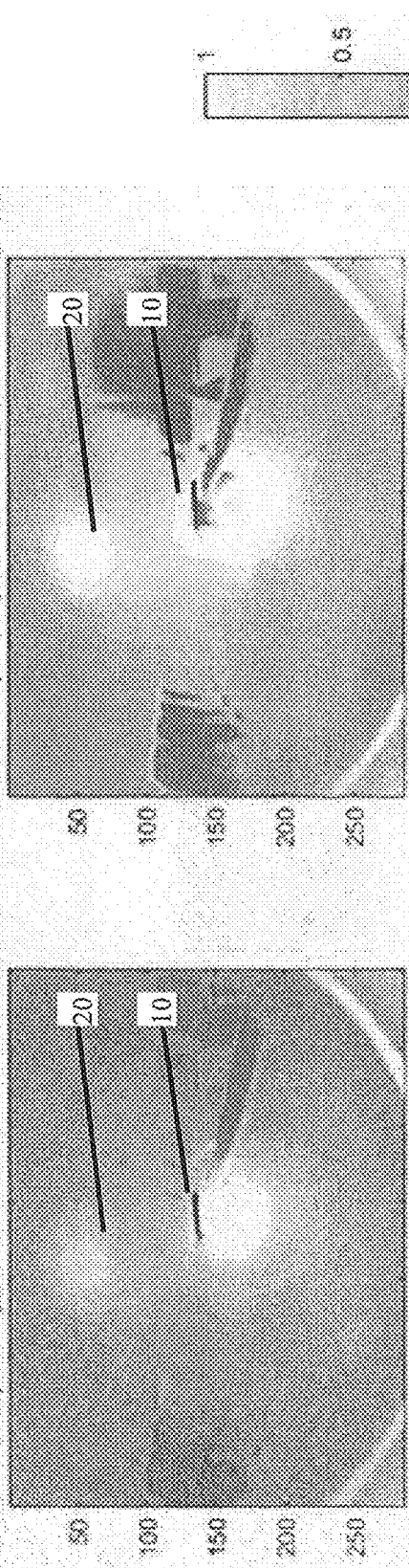
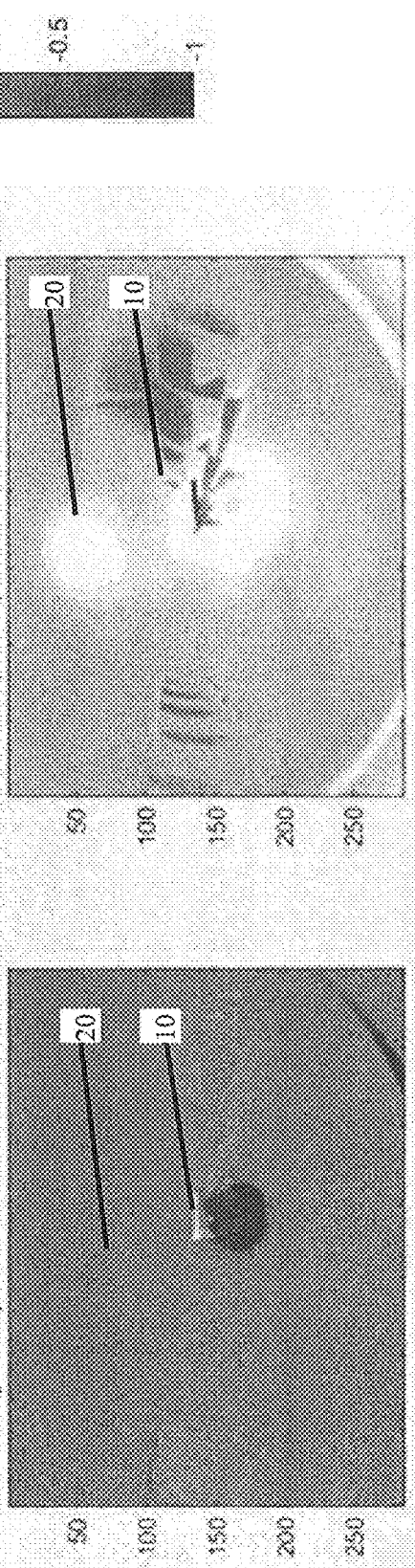
FIG. 14A  FIG. 14B
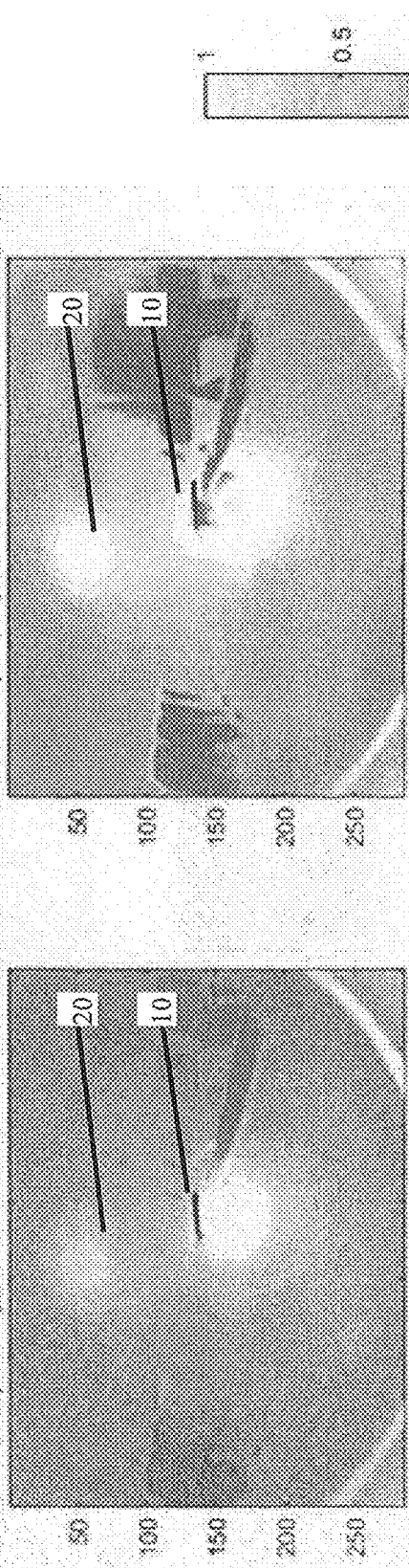
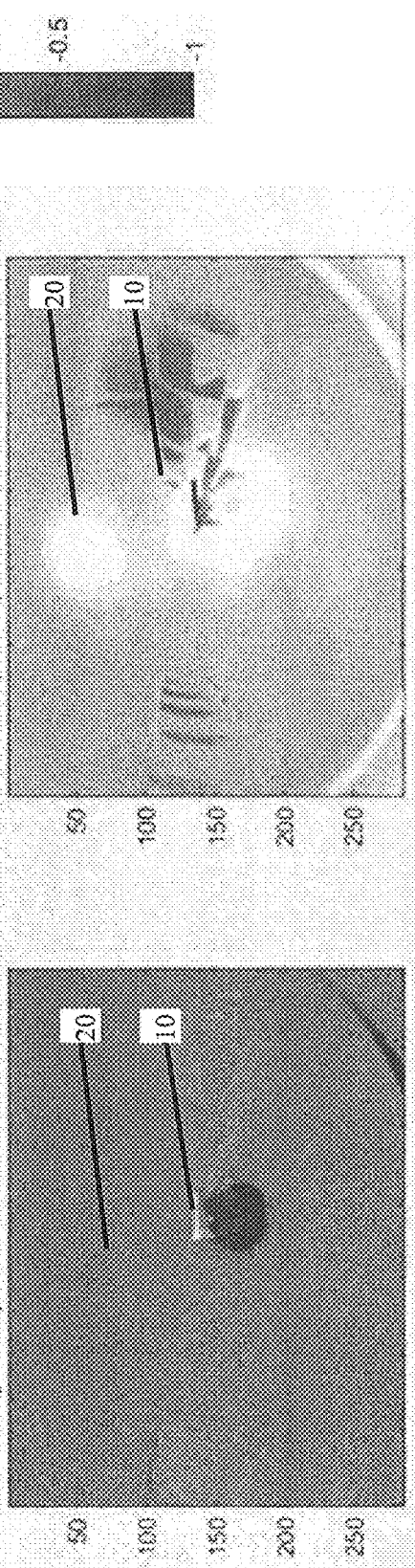
FIG. 14C  FIG. 14D

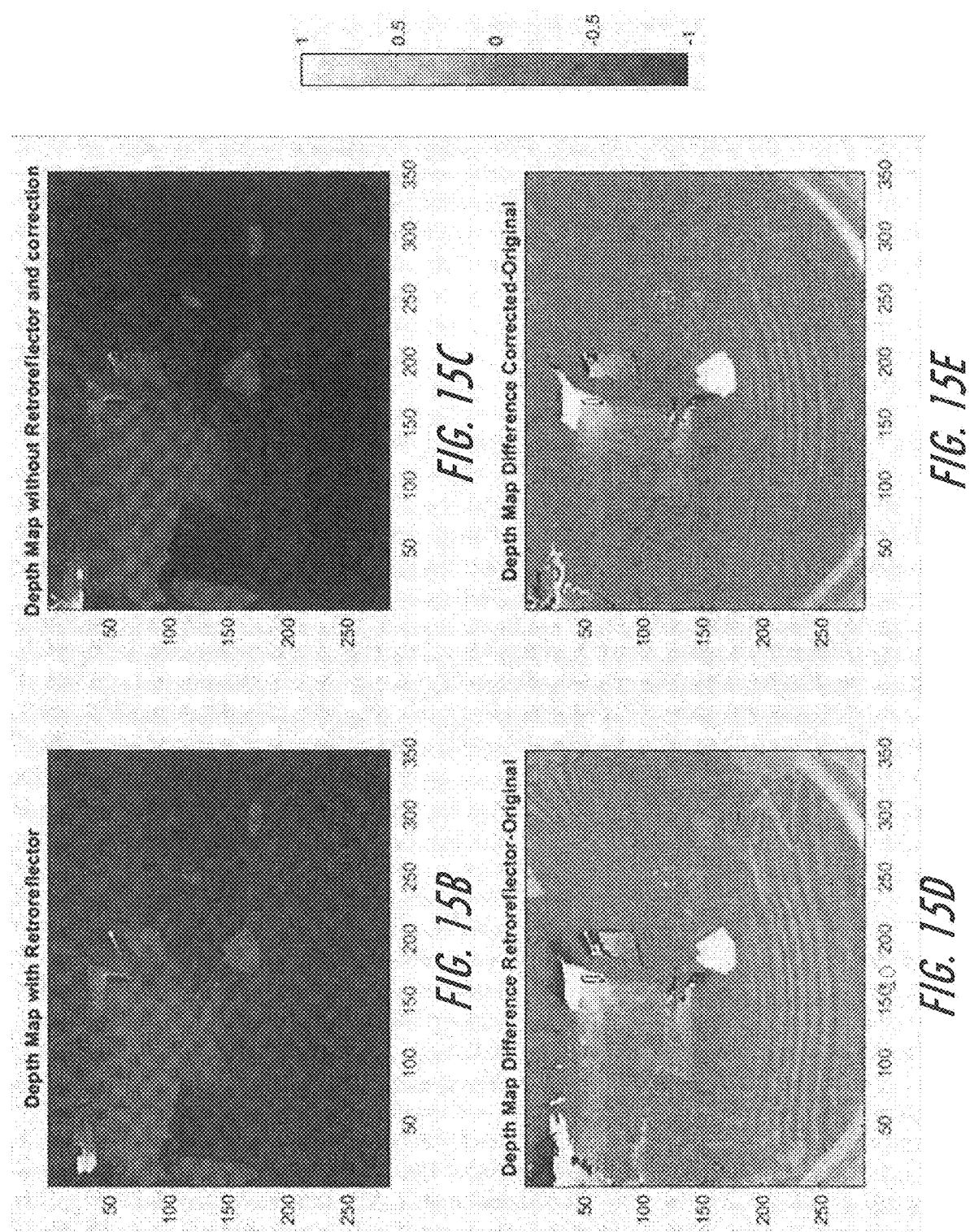

GLARE MITIGATION IN LIDAR APPLICATIONS

CLAIM OF PRIORITY

This application claims priority from U.S. Provisional Patent Application No. 62/724,322 entitled "Phase Background from Bright Objects and Methods of Correction" filed on Aug. 29, 2018, and U.S. Provisional Patent Application No. 62/802,308 entitled "Glare Mitigation in LIDAR Applications" filed on Feb. 7, 2019, the contents of each of which are incorporated by reference herein.

FIELD

The present invention is directed to Light Detection And Ranging (LIDAR) systems, and more particularly, to methods and devices to reduce or eliminate background light in time-of-flight LIDAR systems.

BACKGROUND

Time of flight (ToF) based imaging is used in a number of applications including range finding, depth profiling, and 3D imaging (e.g., LIDAR, also referred to herein as lidar). ToF 3D imaging systems can be categorized as indirect ToF (iToF) or direct ToF systems.

Direct ToF measurement includes directly measuring the length of time between emitting radiation by an emitter element of a LIDAR system, and sensing or detecting the radiation after reflection from an object or other target (also referred to herein as an echo signal) by a detector element of the LIDAR system. From this length of time, the distance to the target can be determined.

Indirect ToF (iToF) measurement includes modulating the amplitude of the emitted signal and measuring the phase delay or phase shift (more generally referred to herein as the phase) of the echo signal, where the time required for the signal to travel to and from an object results in a phase shift that is proportional to the distance traveled. More particularly, the distance range d to a target can be calculated from the detected phase shift of the returning echo signal as:

$$d = \frac{ct}{2} = \frac{\varphi}{2\pi} \frac{c}{2f_m}$$

where c is the speed of light, t is the time required for a photon to travel to the target and back to the detector, $\varphi$ is the phase shift of the modulated signal, and $f_m$ is the modulation frequency. Since the maximum phase shift that can be measured is $2\pi$, the unambiguous range (UR) for the modulation frequency $f_m$ may be expressed as $UR = c/2f_m$.

The unambiguous range may refer to the range beyond which the phase to distance mapping rolls-over or "wraps around" for an iToF system, such that targets beyond the unambiguous range may be reported as being located at a shorter range than their real or actual range ($d_{real}$), where the range reported $d_{reported} = d_{real}$ mod ($2\pi$), or likewise, the phase reported $\varphi_{reported} = \varphi_{real}$ mod ($2\pi$). For example, due to the repeated pulsed nature of the light, an unambiguous range of 10 meters (m) may return a 2 m range measurement for a 12 m object.

Multi-frequency techniques (using light emission at different modulation frequencies) may be used to resolve phase wrap around, such that a matching reported range $d_{reported}$ for two or more different modulation frequencies may identify the actual range. However, the presence of noise or other stray light may result in erroneous phase measurements, and thus inaccurate range calculations.

SUMMARY

Some embodiments described herein provide methods, systems, and devices including electronic circuits that provide a LIDAR system including one or more emitter elements (including semiconductor lasers, such as surface- or edge-emitting laser diodes; generally referred to herein as emitters) and/or one or more light detector elements (including semiconductor photodetectors, such as photodiodes, including avalanche photodiodes and single-photon avalanche detectors (SPADs); generally referred to herein as detectors).

According to some embodiments, a LIDAR detector or apparatus includes one or more optical elements configured to direct incident light in one or more directions, and a detector array comprising a plurality of detector pixels configured to output respective detection signals responsive to light provided thereto by the one or more optical elements. The light includes scattered light that is redirected relative to the one or more directions. The LIDAR apparatus further includes a circuit configured to receive the detection signals from the detector array and generate corrected image data based on the detection signals and an expected spread function for the light. The expected spread function may be a glare spread function (GSF) determined for the optical elements and/or an intensity map determined for the scattered light.

In some embodiments, the circuit may be configured to generate the corrected image data based on a mathematical relationship between the detection signals and the expected spread function.

In some embodiments, the expected spread function may be a glare spread function. The glare spread function may indicate distribution of light emission from a point light source to the plurality of detector pixels by the one or more optical elements.

In some embodiments, the circuit may be configured to detect distribution of light emission from a point light source to the plurality of detector pixels by the one or more optical elements, and may be configured to generate the glare spread function based on the distribution. The light emission from the point light source may be of a same wavelength as at least one emission wavelength of an emitter of the LIDAR apparatus.

In some embodiments, the circuit may be configured to generate the corrected image data based on deconvolution of image data represented by the detection signals and the glare spread function.

In some embodiments, the expected spread function may be a scattered light intensity map. The scattered light intensity map may include respective scatter intensities of the scattered light over a field of view of the detector array.

In some embodiments, the circuit may be configured to generate the corrected image data based on subtraction of the scattered light intensity map from image data represented by the detection signals.

In some embodiments, the respective scatter intensities may be substantially uniform over the field of view. In some embodiments, the respective scatter intensities may be spatially-varying over the field of view.

In some embodiments, the circuit may be configured to correlate the respective scatter intensities to respective detector pixels of the plurality of detector pixels. The subtraction may include pixel-by-pixel subtraction of the respective scatter intensities from respective detection signals output from the respective detector pixels correlated thereto.

In some embodiments, the detection signals may represent the light detected by the detector pixels for a respective measurement subframe. The circuit may be configured to generate the scattered light intensity map based on outputs from a subset of the detector pixels for an acquisition subframe of a shorter duration than that of the measurement subframe.

In some embodiments, the outputs from the subset of the detector pixels may define a retroreflective target intensity map. The retroreflective target intensity map may include respective intensities of a subset of the light reflected from at least one retroreflective target in the field of view and/or objects in the field of view at a distance range that is substantially equal to a distance range of the at least one retroreflective target. The circuit may be configured to generate the scattered light intensity map by combining the retroreflective target intensity map with a glare spread function for the one or more optical elements, for example, based on convolution of the retroreflective target intensity map with the glare spread function.

In some embodiments, the circuit may be configured to determine a distance range of a target in a field of view of the detector array based on the corrected image data.

In some embodiments, the LIDAR apparatus may be configured to be coupled to a vehicle and oriented such that the field of view of the detector array includes an intended direction of travel of the vehicle.

According to some embodiments, a method of operating a LIDAR apparatus includes operations performed by a circuit of the LIDAR apparatus. The operations include receiving detection signals output from detector pixels of a detector array responsive to light provided thereto by one or more optical elements configured to direct incident light in one or more directions, where the light includes scattered light that is redirected relative to the one or more directions; and generating corrected image data based on the detection signals and an expected spread function for the light.

In some embodiments, generating the corrected image data may be based on a mathematical relationship between the detection signals and the expected spread function.

In some embodiments, the expected spread function may be a glare spread function for the one or more optical elements. The mathematical relationship may include deconvolution of image data represented by the detection signals and the glare spread function.

In some embodiments, the expected spread function may be a scattered light intensity map comprising respective scatter intensities of the scattered light over a field of view of the detector array. The mathematical relationship may include subtraction of the scattered light intensity map from image data represented by the detection signals.

According to some embodiments, a LIDAR detector or apparatus includes one or more optical elements configured to direct incident light in one or more directions, and a detector array including a plurality of detector pixels configured to output detection signals responsive to light provided thereto by the one or more optical elements. The light includes scattered light that is redirected relative to the one or more directions. A circuit is configured to determine a distance range of at least one retroreflective target in a field of view of the detector array, and generate corrected image data based on the detection signals responsive to determining the distance range of the at least one retroreflective target.

In some embodiments, the circuit may be configured to generate detector control signals that control operation of the detector pixels based on the distance range of the at least one retroreflective target. In response to the detector control signals, the detector pixels may be configured to output detector signals that omit a subset of the light corresponding to the distance range of the at least one retroreflective target.

In some embodiments, the detector control signals may include time slots corresponding to respective distance ranges. The detector pixels may be configured to exclude integration of photocharges during one of the time slots corresponding to the distance range of the at least one retroreflective target.

In some embodiments, the circuit may be configured to determine a distance range of a target in a field of view of the detector array based on the corrected image data.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIG. 11 is a diagram illustrating another example for generating corrected image data based on mathematical relationships between detection signals output from respective detector pixels and an expected spread function according to some embodiments of the present invention.

FIG. 12 is a diagram illustrating another example for generating corrected image data based on mathematical relationships between detection signals output from respective detector pixels and an expected spread function according to some embodiments of the present invention.

FIGS. 14A, 14B, 14C, and 14D are images of a field of view illustrating phase component differences for different modulation frequencies when a retroreflector is placed in a field of view.

FIGS. 15A, 15B, 15C, 15D, and 15E are images illustrating effects of subtraction of uniform phase background in accordance with some embodiments of the present invention.

DETAILED DESCRIPTION OF EMBODIMENTS

Some embodiments of the present invention may arise from recognition that light entering a lens in a LIDAR system may have a chance of scattering, ghosting, or flaring, resulting in inaccurate detection. Scattered light may be received at any pixel of the detector array, including or instead of the pixel(s) to which the light entering the lens was otherwise directed. Flared light may end up being received at pixels of the detector array that are adjacent or nearby the actual pixel targets. Lens flare or ghosting may cause other optical artifacts. Such light that is redirected to pixels other than the pixel(s) to which the light was otherwise directed may be referred to herein as glare, scattering, background light or signals, "light pollution," or more generally, stray light. When comparatively brighter objects (such as objects near to the camera or highly reflective objects, generally referred to herein as retroreflective targets) are imaged by a detector array, the stray light may be sufficient to result in an erroneous measurement (e.g., erroneous phase measurements based on detection signals that include the background contributions), in some instances for relatively large numbers of pixels. Any distance range calculations based on these erroneous measurements are likewise erroneous.

A LIDAR system may include an array of emitter elements and an array of detector elements, or a system having a single emitter element and an array of detector elements, or a system having an array of emitters and an array of detector elements. A flash LIDAR system may acquire images by emitting light from an array of emitter elements for short durations (pulses) over a field of view (FOV) and detecting the reflected light emission. Subregions of the array of emitter elements are arranged to direct light to (and subregions of the array of detector elements are arranged to receive light from) respective subregions within the FOV, which are also referred to herein as regions of interest (ROI). A non-flash or scanning LIDAR system may generate image frames by raster scanning light emission (continuously) over a field of view, for example, using a point scan or line scan to emit the necessary power per point and sequentially scan to reconstruct the full FOV from detection of the reflected light emission.

Figure 1:
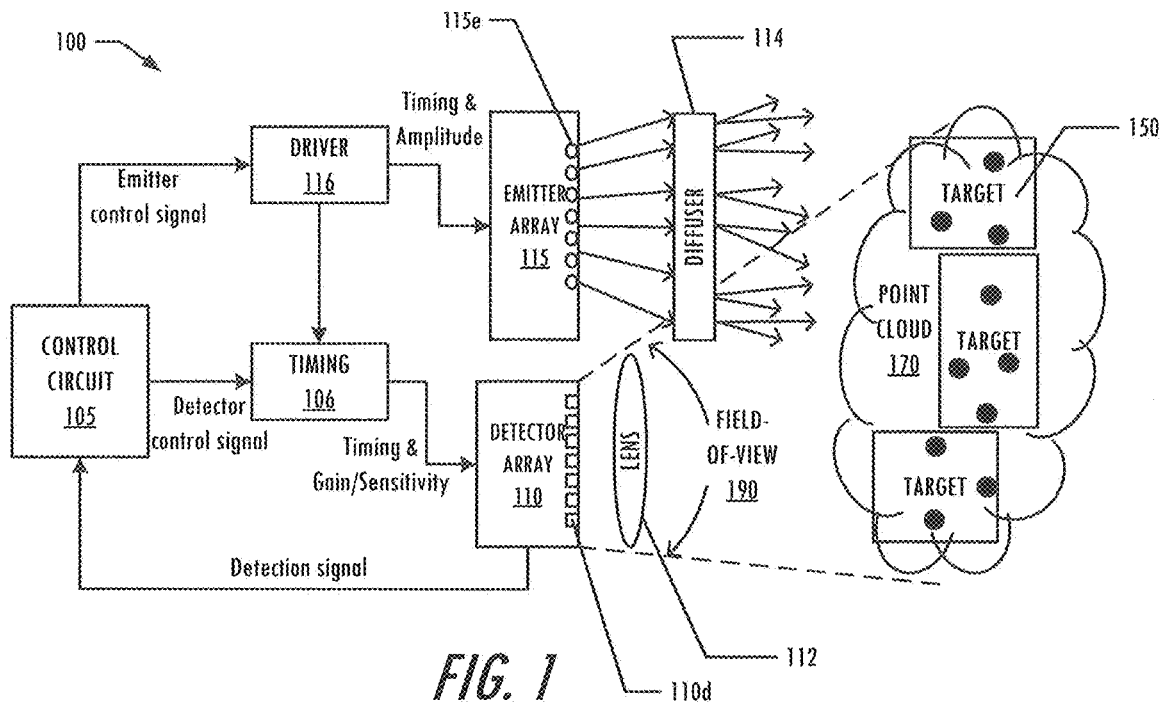
FIG. 1 is a block diagram illustrating a flash LIDAR system or circuit that is configured to correct or compensate for stray light in accordance with embodiments of the present invention.

An example of a flash LIDAR system or circuit 100 that is configured to compensate for background in accordance with embodiments of the present invention is shown in FIG. 1. The system 100 includes a control circuit 105, a timing circuit 106, an emitter array 115 including a plurality of emitters 115e, and a detector array 110 including a plurality of detectors 110d (for example, an array of single-photon detectors). One or more of the emitter elements 115e of the emitter array 115 may define emitter pixels that respectively emit a radiation pulse or continuous wave signal (for example, through a diffuser or optical filter 114) at a time and frequency controlled by a timing generator or driver circuit 116. In particular embodiments, the emitters 115e may be pulsed light sources, such as LEDs or lasers. Radiation is reflected back from a target 150, and is sensed by detector pixels defined by one or more detector elements 110d of the detector array 110. The control circuit 105 implements a pixel processor that measures the time of flight of the illumination pulse over the journey from emitter array 115 to target 150 and back to detector array 110, using direct or indirect ToF measurement techniques.

The system 100 includes an emitter array 115 including a plurality of emitters 115e and a detector array 110 including a plurality of detectors 110d. In particular embodiments, the emitters 115e may be vertical cavity surface emitting lasers (VCSELs), and/or the detectors 110d may be single photon detectors, such as single photon avalanche detectors (SPADs). In some embodiments, each of the emitters 115e in the emitter array 115 is connected to and controlled by a respective driver circuit 116. In other embodiments, respective groups of emitters 115e in the emitter array 115 (e.g., emitter elements 115e in spatial proximity to each other), may be connected to a same driver circuit 116. The driver circuit or circuitry 116 may include one or more driver transistors configured to control the modulation frequency, timing and amplitude of the optical emission signals that are output from the emitters 115e. The emission of optical signals from multiple emitters 115e and detection by detector(s) 110d provides a single image frame for the flash LIDAR system 100. The maximum optical power output of the emitters 115e may be selected to generate a signal-to-noise ratio of the echo signal from the farthest, least reflective target at the brightest background illumination conditions that can be detected in accordance with embodiments described herein. A diffuser 114 is illustrated to increase a field of view of the emitter array 115 by way of example.

Light emission output from one or more of the emitters 115e impinges on and is reflected by one or more targets 150, and the reflected light is detected as an optical signal (also referred to herein as an echo signal or echo) by one or more of the detectors 110d (e.g., via an optical system including one or more optical elements, such as lenses 112), converted into an electrical signal representation (referred to herein as a detection signal representing image data), and processed (e.g., based on time of flight) to define a 3-D point cloud representation 170 of the field of view 190. An image frame or subframe represented by the detection signals output from the detectors 110d detector array 110 may be generally referred to herein as image data. Operations of LIDAR systems in accordance with embodiments of the present invention as described herein may be performed by one or more processors or controllers, such as the control circuit 105 of FIG. 1.

Figure 2:
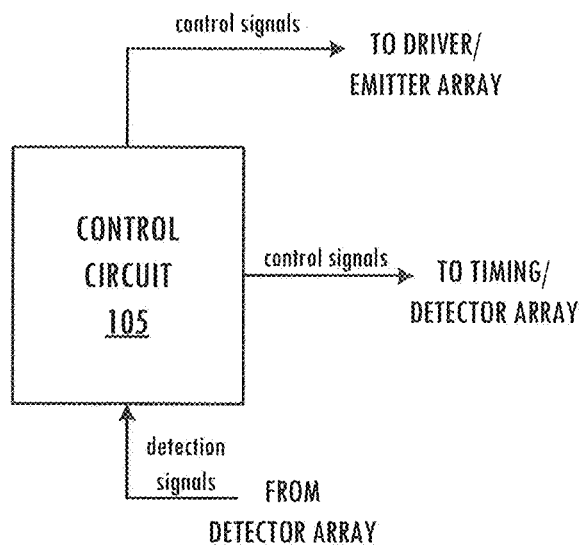
FIG. 2 is a block diagram illustrating the control circuit of FIG. 1 in greater detail.

FIG. 2 illustrates the control circuit 105 of FIG. 1 in greater detail. In some embodiments, the control circuit 105 may include a pixel processor that outputs emitter control signals and detector control signals to the emitter array 115 and detector array 110 to control the emission of the optical signals and the detection of the reflective optical signals, respectively. The control circuit 105 calculates the distance to the target 150 by measuring the duration of time or phase delay/phase shift of an illumination pulse or wave over the journey from the emitter array 115 to a target 150 and back to the detector array 110 (i.e., the difference in time or phase between the optical signal emitted by the emitter array 115 and the reflected optical signal or echo received at the detector array 110, as indicated by the respective detection signals output from the detector array 110). Portions or an entirety of the control circuits described herein may be integrated in the emitter array 115 and/or detector array 110 in some embodiments. Although illustrated with reference to a flash LIDAR system, it will be understood that embodiments described herein may also include non-flash or scanning (also referred to as "line scanning" or "point scanning" without loss of generality to other types of scanning) LIDAR systems, in direct- or indirect-ToF LIDAR applications.

Some iToF LIDAR systems operate by transmitting (from one or more emitters defining an emitter pixel), receiving (at one or more detectors defining a detector pixel), and measuring (at one or more processors or control circuits) the phase of optical signals at multiple different modulation frequencies (also referred to herein as measurement frequencies). The phases are associated with distances of objects and may be measured at each pixel with a series of separate measurements. The results of these measurements produce multiple (e.g., two) vector components, the angle formed by these components is the phase. For example, the emitter pixels of a LIDAR system may emit a continuous modulated sinusoidal or square wave light signal at each of the multiple frequencies, and the phases of the echo signals received at each detector pixel may be measured by the control circuit. For each measurement frequency, the phase may be related to the distance range of an object contained in or imaged by the pixel, though they may change at different rates. As the associated wavelengths of the measurement frequencies are typically shorter than the read range or imaging range, the combination of two phases (one at each measurement frequency) can be used to uniquely identify the distance. That is, distance may be determined by analyzing respective signals at multiple (e.g., two) separate or distinct modulation frequencies, such that the true or actual location of the target may be indicated where the measurements at the different modulation frequencies agree or match. The phase of the returning light signal (after reflection by a target in the field of view) may be converted to distance using a lookup table to map phase space to distance, and/or using quadrature sampling techniques.

In some embodiments, for each of the modulation or measurement frequencies of the optical signals output by the emitter array 115, the control circuit 105 may perform a phase measurement that is based on multiple component measurements or measurement subframes of an image frame (referred to herein with reference to four measurements, D0, D1, D2, and D3) indicative of the different phases of the detection signals output from the detector array 110. The respective component measurements D0, D1, D2, and D3 may be samples of the returning echo signals that are taken at respective phase offsets (e.g., at 0°, 90°, 180°, and 270° phase delays) with respect to a chip reference signal for the detector array 110. It will be understood that the description herein with reference to four measurements, D0, D1, D2, and D3 with phase offsets of 0°, 90°, 180°, and 270° is by way of example only, and that embodiments of the present invention may utilize fewer or more component measurements for distance range calculation. For example, in some embodiments, only a subset of the four measurements (e.g., only the 0° and 90° components) may be sampled or otherwise utilized.

More particularly, each of the detector elements 110d of the detector array 110 is connected to a timing circuit 106. The timing circuit 106 may be phase-locked to the driver circuitry 116 of the emitter array 115. The timing of operation and sensitivity of each of the detector elements 110d or of groups of detector elements 110d may be controlled by the timing circuit 106. The timing circuit 106 may operate respective detector pixels (including one or more detector elements 110d) of the detector array 110 to sample the echo signals at respective phase offsets (e.g., 90°, 180°, 270°) corresponding to the respective measurement subframes. The detection signals output from the detector array 110 may represent respective component measurements D0, D1, D2, D3 sampled at phase offsets 0°, 90°, 180°, 270°, respectively.

Figure 3:
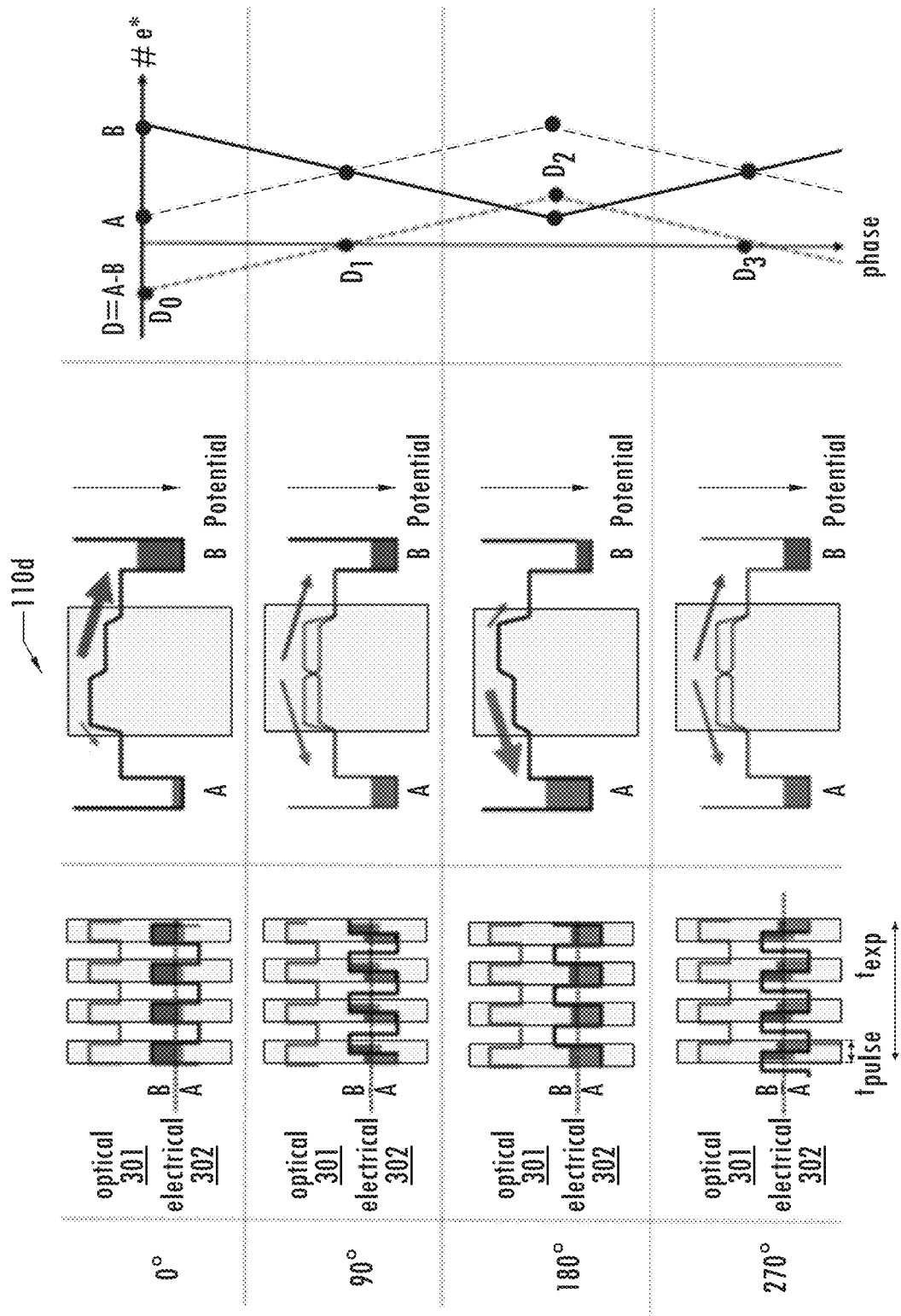
FIG. 3 illustrates a sampling process for operating respective detector pixels of a detector array in accordance with embodiments of the present invention.

FIG. 3 illustrates a sampling process for operating respective detector pixels of a detector array in accordance with embodiments of the present invention. As shown in FIG. 3, a detector element 110d of a detector array 110 may include first and second accumulator wells A and B, with each well being modulated on and off by the control circuit 105 or associated timing circuit 106 to detect incident photons for respective portions (or "time windows") of each measurement subframe, also referred to herein as integration time. For iToF systems, the modulation of each measurement subframe D0, D1, D2, D3 may be delayed or "shifted" by a fraction of the period defined by the respective measurement frequency $f_m$ (where the period=$1/f_m$). Each subframe may thus be a measurement (responsive to the electrical signal pulse 302) of a phase component that is 0, 90, 180, or 270 degrees out of phase (or offset) with respect to a reference optical signal pulse 301 (with a pulse width $t_{pulse}$) or other reference signal, with operation of the detector(s) being shifted by one-quarter of the period corresponding to the measurement frequency for each of the four subframes. The detection signals measured in the D0 (0°) and D2 (180°) subframes are correlated (illustrated as being equal and opposite), as are the detection signals measured in the D1 (90°) and D3 (270°) subframes. For example LIDAR systems as described herein using two measurement frequencies, distance may be measured using eight subframes (i.e., four component measurements or subframes D0, D1, D2, D3 at each of the two measurement frequencies).

Figure 4A:
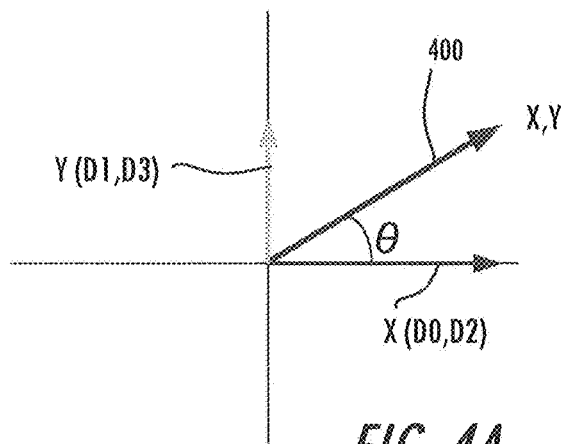
FIGS. 4A and 4B are vector diagrams illustrating phase measurement operations performed by a control circuit in accordance with embodiments of the present invention and effects of phase background thereon, respectively.
Figure 4B:
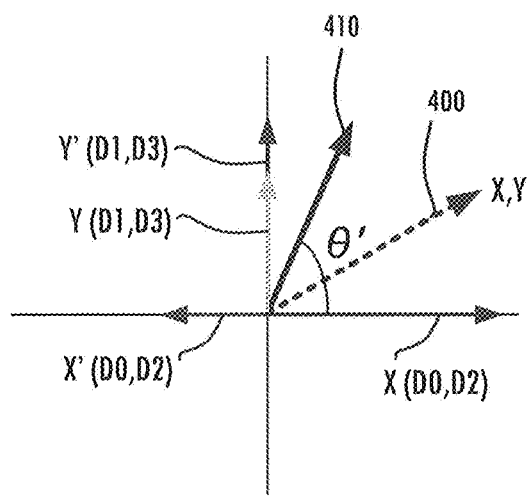

The accuracy of the phase estimates based on the operations illustrated in FIG. 3 may be susceptible to detection of light from targets with different phases. FIGS. 4A and 4B are diagrams illustrating effects of phase background on operations performed by a control circuit, such as the control circuit 105 of FIGS. 1 and 2, in accordance with embodiments of the present invention.

Referring to FIG. 4A, the component measurements represent multiple (e.g., two orthogonal) vector components X,Y defining a phase vector 400. In rectangular form, the data in the D0 (0°) and D2 (180°) subframes define horizontal (or X−) components of the vector 400, and can be combined (e.g., by vector addition) in a single data channel X. The data in the D1 (90°) and D3 (270°) subframes define vertical (or Y−) components of the vector 400, and can be likewise combined in a single data channel Y. In other words, the first vector component X (e.g., from the 0° and 180° measurements; also referred to as in-phase components) may represent a horizontal/x-axis component, and the second vector component Y (e.g., from the 90° and 270° measurements; also referred to as quadrature components) may represent a vertical/y-axis component. The phase of a received detection signal for each measurement frequency may be the angle θ defined by the vector X,Y 400 (also referred to herein as the primary signal vector) represented by the component measurements (e.g., as computed from the arctangent of the X and Y components). That is, the two pairs of component measurements (the 0°, 180° components and the 90°, 270° components) for a measurement frequency may be combined into horizontal and vertical components, respectively, of a phase vector X,Y 400 for that measurement frequency, with the angle θ formed by these components being the phase.

As shown FIG. 4B, phase background may result in detection of a secondary signal vector with vector components X' and Y' (also referred to herein as a distortion vector), in addition to the signal represented by the primary signal vector X, Y 400. The resulting detection signal is represented by a new vector 410. The phase of the new vector 410 may be the angle θ' of the combined vector sum of components X and Y of the primary signal vector 400 with components X' and Y' of the secondary signal or distortion vector. If the distortion vector is large compared to the primary signal vector, the distortion phase may predominate the overall measurement (as shown by angle θ'). This distortion may manifest as positional distortion of dim objects, and thus, erroneous distance or range calculation of the dim objects. In some embodiments, scattering of relatively brighter incident light may cause phase background artifacts.

Background artifacts, including phase background for iToF measurements, may be detected when a portion of light entering a lens in a lidar system, which should be directed by the lens to one or more particular detector pixels, is reflected or otherwise redirected by aspects of the optical system, including (but not limited to) the lens quality and distance between the lens and the detector pixels. The light entering the lens thus additionally or alternatively illuminates one or more other detector pixels, which are different from the particular detector pixel(s) intended by the configuration of the optical system. This redirection of the incident light is generally referred to herein as scattering or scattered light, and may include optical flare or glare, ghosting, optical cross talk, or any other light pollution as described herein.

Figure 5:
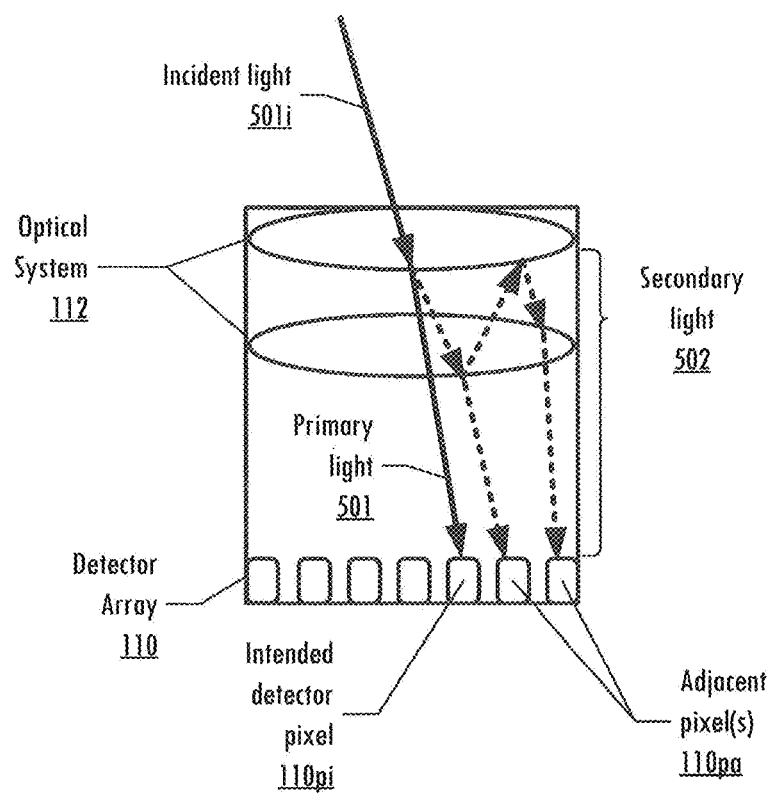
FIG. 5 is a schematic diagram illustrating effects of optical scattering in a detector including an optical system and detector array in accordance with embodiments of the present invention.

FIG. 5 is a schematic diagram illustrating how incident light 501i (e.g., from a single field point) that is directed to illuminate one or more particular detector pixels 110pi (also referred to herein as primary light 501) can be redirected or scattered into secondary light 502 that illuminates one or more different pixels 110pa. In the example of FIG. 5, the optical system 112 includes one or more optical elements or lenses that are configured to direct the incident light 501i in one or more directions to provide primary light 501 to the detector pixel 110pi, as shown by the solid rays. However, based on non-idealities of the optical system 112 and/or other aspects the detector, the light 501i is additionally or alternatively redirected into secondary or stray light 502, as shown by the dashed rays, resulting in detection by adjacent detector pixels 110pa. This detection of stray light 502 may manifest as a broadening (e.g., optical flare or glare) of the apparent point spread function from a single field point, and/or an overall increase in the background signal across the entire detector array 110, resulting in erroneous phase detection and inaccurate range estimation based thereon. The secondary or stray light 502 may generally be referred to herein as scattered light.

In both direct and indirect ToF applications, glare may be characterized by measurement of the glare spread function (GSF) of an optical system. The GSF is a measure of the stray light performance of the optical system, providing information indicating how light from a point source is actually distributed across the detector array (e.g., the image plane) as a result of non-idealities and/or other aspects of the optical system 112 that are not considered by purely sequential imaging optics simulations. The GSF may be specific to and measured based on the arrangement of the optical element(s) and the detector array in the LIDAR apparatus.

Figure 6:
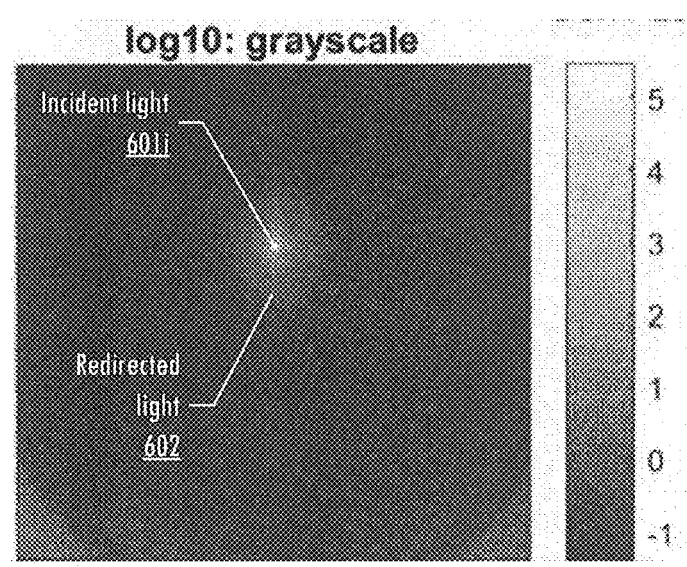
FIG. 6 illustrates a glare spread function for an optical system in accordance with some embodiments of the present invention.

FIG. 6 illustrates a measured GSF function for an optical system in accordance with some embodiments of the present invention. In particular, FIG. 6 illustrates that the light 601i that is directed to or should be incident on a single detector pixel is redirected and spread as stray or scattered light 602 across multiple other detector pixels of the detector array, for example, by non-ideal optics. A control circuit, such as the control circuit 105 of FIGS. 1 and 2, may be configured to access or measure the GSF for the optical system 112 and/or detector including the optical system 112. For example, a baffled tube with black-out paint on the interior may be used to completely extinguish light from all field points visible to the lens, except for a single, point of light 601i provided by using an optical fiber to direct light from the emitter back toward the lens of the optical system 112. The point of light 601i may have a same emission wavelength as the light output from one or more of the emitters 115e. As the light detected by the detector array 110 should ideally be directed to only a single detector pixel 110pi with this point light source 601i, the actual light 601i, 602 detected by the detector pixels of the detector array in response to the incident point light source 601i can be used as an estimated or measured GSF. In some embodiments, an iterative and/or machine learning process may be used to improve or refine the measured GSF. For example, detected light from a point light source may be corrected using a previously-measured GSF and compared with a simulated or ideal result to determine a quality metric, which may be used to refine the measured GSF, and the above process may be iterated using the refined GSF.

Glare can be particularly problematic for iToF detector arrays, as the distance information for each detector pixel is obtained by measurement of the phase delay of an amplitude modulated signal. For example, as discussed above with reference to FIGS. 4A and 4B, in a phase measurement, a detector pixel may sample four different phase delays (e.g., with phase shifts of 0, 90, 180, and 270 degrees), and a control circuit may compute the arctangent of the "I" (in phase) and "Q" (quadrature) components to determine the phase angle θ. These phase components can be measured by integrating over multiple emitter pulse cycles, but may not distinguish or indicate where the light entering the detector pixel comes from. For a detector pixel that is positioned to image a relatively weaker target in the field of view (e.g., a target that is less reflective and/or at a farther distance relative to other targets, and from which a relatively weaker echo signal is received), the overall phase measurement may be represented by the vector sum of the signal return from that weak target, as well as the light pollution due to glare from brighter targets in the field of view (e.g., targets that are more reflective and/or at a closer distance relative to other targets, and from which a relatively stronger echo signal is received), as detected by different or adjacent pixels that are positioned to image points or regions of the field of view other than those corresponding to the weaker target.

Figure 7:
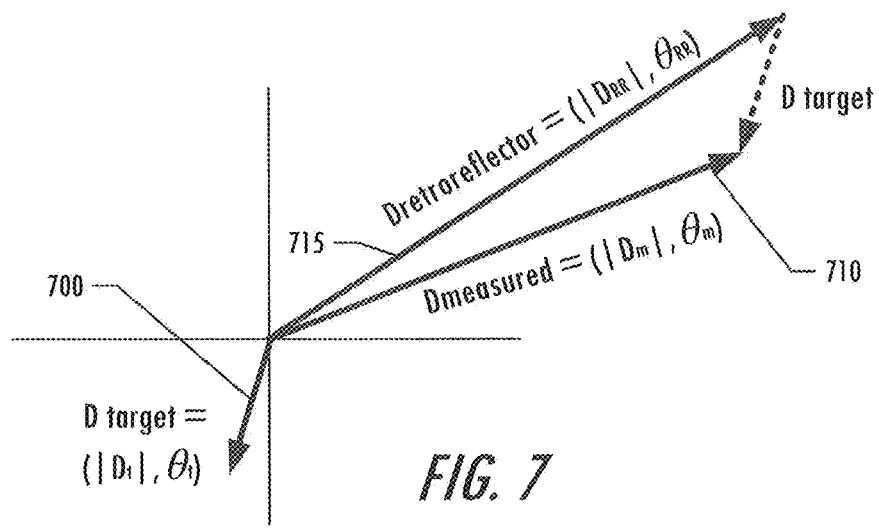
FIG. 7 is a vector diagram illustrating effects of glare on phase measurement operations performed by a control circuit in accordance with embodiments of the present invention.

FIG. 7 is a vector or phasor diagram illustrating effects of glare from a brighter target on phase measurement operations performed by a control circuit, such as the control circuit 105 of FIGS. 1 and 2, in accordance with embodiments of the present invention. As shown in FIG. 7, the measured vector $D_{measured}$ 710 indicated by a detection signal output from one or more detector pixels arranged to image a weaker target can significantly differ from the actual vector $D_{target}$ 700 for the weaker target, due light $D_{retroreflector}$ 715 resulting from glare of light from a brighter target (whose phase is generally different). That is, FIG. 7 illustrates how the vector or phasor measurement for a pixel corresponding to a target that returns a weaker echo signal can be corrupted by light that that is scattered (or "leaks") from another brighter target or region of the field of view.

Embodiments described herein provide methods and related devices that are configured to reduce or eliminate problems associated with imaging brighter objects (e.g., retroreflectors or very near objects) in the field of view of lidar systems. A retroreflector or retroreflective target may refer to an object in the field of view of a LIDAR system that may aim the beam of reflected light directly back at the detector array (as opposed to a lambertian reflective surface which reflects light with uniform brightness in all directions). Some conventional glare reducing methods have been implemented by hardware improvements that attempt to mitigate the degree to which glare occurs, i.e., hardware changes that try to sharpen the GSF to a more perfect delta function.

Some embodiments described herein may arise from recognition that an expected spread function (such as the GSF and/or an intensity map that results from a retroreflective target on a plurality of the pixels across multiple regions or the entirety of the detector array) may be used to calculate and redact glare-related and/or other background-related signal components and thereby output stray light-corrected or stray light-compensated image data (also referred to as "corrected" image data herein), described in some embodiments with reference to glare-compensated signals when based on a GSF as described above. That is, embodiments described herein are configured or otherwise operable to calculate or otherwise determine an expected spread function for the light, and to use the expected spread function along with the detection signals (or measured data indicated thereby) to compute corrected image data, in some embodiments on a per-frame, per-subframe, or per-pixel basis. The corrected image data may thus have reduced light pollution, such that ranges of one or more targets in a field of view of the detector array may be calculated with increased accuracy and/or reduced computational burden in accordance with various embodiments described herein.

Figure 8:
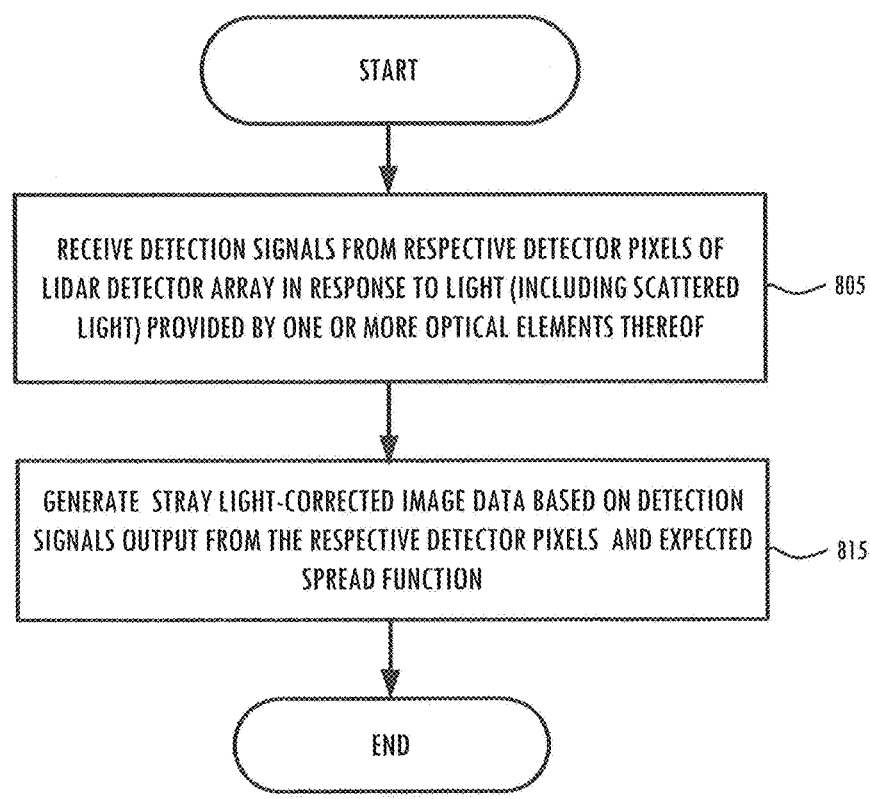
FIG. 8 is a flowchart illustrating operations for generating corrected image data in accordance with some embodiments of the present invention.

FIG. 8 is a flowchart illustrating operations for generating stray light-corrected image data in accordance with some embodiments of the present invention. The operations of FIG. 8 may be performed by one or more processors or controllers, such as the control circuit 105 of FIGS. 1 and 2.

Referring now to FIG. 8, at block 805, detection signals are received from respective detector pixels of a detector array of a LIDAR apparatus in response to light provided by one or more optical elements of the LIDAR apparatus. The light provided by the optical element(s) includes stray or scattered light that is redirected relative to one or more directions into which the optical element(s) are otherwise configured to direct the incident light. An expected spread function for the LIDAR apparatus is also determined or calculated. For example, the expected spread function may be based on the glare spread function (GSF) for the optical element(s) and detector array of the LIDAR apparatus, and/or based on a scattered light intensity map indicating a correlation between respective detector pixels and respective scatter intensities over the field of view. Stray-light corrected image data is generated at block 815, based on the detection signals output from the respective detector pixels and the expected spread function. For example, the corrected image data may be generated based on mathematical relationships between the detection signals and the expected spread function. This corrected image data with reduced background or other light pollution may be used to calculate range estimates of targets in the field of view with increased accuracy.

Examples of determining the expected spread function (such as a GSF and/or a scattered light intensity map including respective scatter intensities that are correlated to the respective detector pixels) and generating corrected image data based on mathematical relationships (e.g., subtraction, division, convolution) between detection signals output from respective detector pixels and the expected spread function at block 815 of FIG. 8 are described below by way of example with reference to FIGS. 9A-9C and FIGS. 10-12. It will be understood that these examples may be performed using an expected spread function obtained in accordance with any of the embodiments described herein, and is not limited to any one method of obtaining the expected spread function. Embodiments described herein provide LIDAR systems or apparatus, including one or more elements of the system 100 of FIG. 1, including one or more processors or controllers, such as the control circuit 105 of FIGS. 1 and 2, that are configured to perform calculations and/or other operations described herein to generate the expected spread function and corrected image data, and to more accurately determine a range of one or more targets in the field of view based on the corrected image data.

Figure 9A:
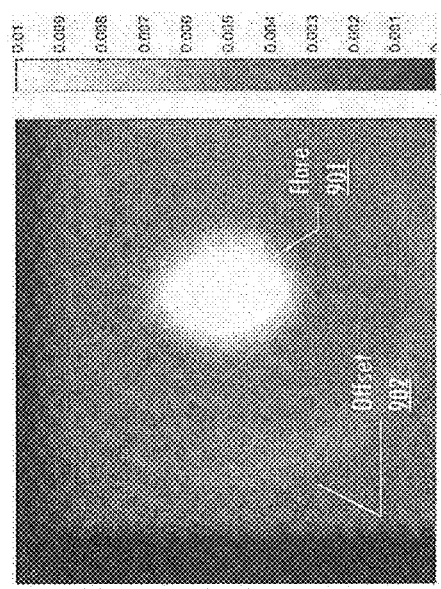
FIGS. 9A, 9B, and 9C are images illustrating operations for generating corrected image data in accordance with some embodiments of the present invention.
Figure 9B:
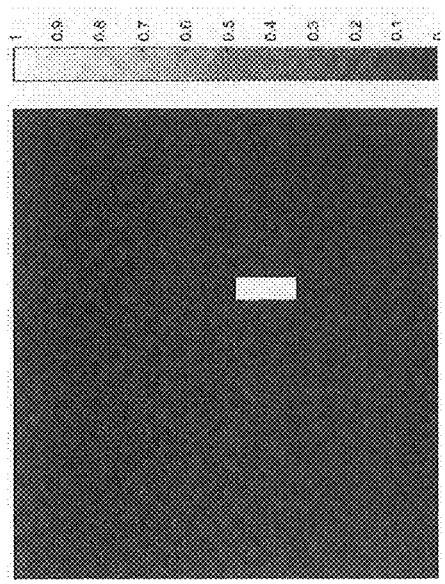
Figure 9C:
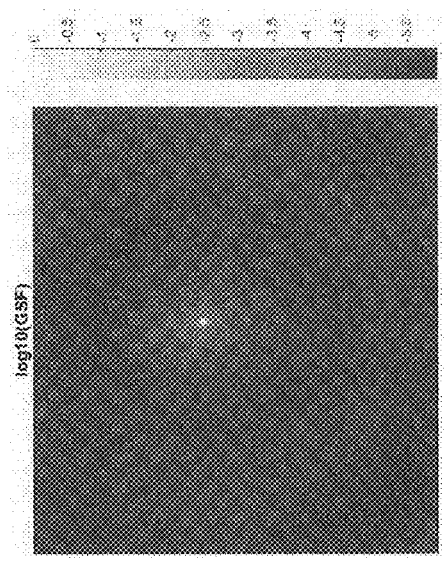

FIGS. 9A-9C are images illustrating operations for generating corrected image data in accordance with some embodiments of the present invention. In particular, FIG. 9A illustrates measured image data p(x,y) indicated by the detection signals output by the respective detector pixels of a detector array for a FoV imaged thereby, FIG. 9B illustrates corrected image data i(x,y) generated as described herein, and FIG. 9C illustrates the GSF g(x,y) for the optical elements and detector array of a LIDAR apparatus according to some embodiments of the present invention.

Figure 10:
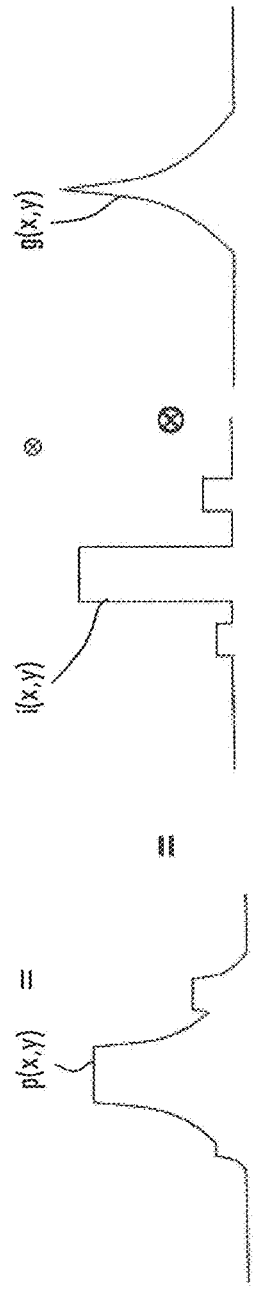
FIG. 10 is a diagram illustrating an example for generating corrected image data based on mathematical relationships between detection signals output from respective detector pixels and an expected spread function according to some embodiments of the present invention.

FIG. 10 illustrates one example for generating corrected image data based on mathematical relationships (here, including convolution, deconvolution, division, and/or Fourier transformation) between detection signals output from respective detector pixels and an expected spread function according to some embodiments of the present invention. In FIG. 10, the GSF g(x,y) is used as the expected spread function. As shown in FIG. 10, the corrected image data i(x,y) shown in FIG. 9B may be computed based on the GSF g(x,y) shown in FIG. 9C and the measured image data p(x,y) indicated by the detection signals shown in FIG. 9A (representing a full or high-dynamic range (HDR) image frame):

$$p(x,y) = \text{CONV}(i(x,y), g(x,y))$$

where CONV(i,g) is the convolution of the corrected image data i(x,y) and the GSF g(x,y). The GSF g(x,y) may represent a transfer function of the optical system or element(s) 112. Solving for i(x,y) can be calculated by deconvolution of the measured image data p(x,y) represented by the detection signals and the GSF g(x,y) (e.g., by computing and dividing respective fast Fourier transforms (FFTs) of the measured data p(x,y) and the GSF g(x,y) and performing an inverse transform of the result) to recover the corrected image data:

$$i(x,y) = \text{IFFT}(\text{FFT}(p)/\text{FFT}(g)).$$

FIG. 11 illustrates another example for generating corrected image data based on mathematical relationships (here, subtraction) between detection signals output from respective detector pixels and an expected spread function according to some embodiments of the present invention. In FIG. 11, a scattered light intensity map d(x,y) is used as the expected spread function. As shown in FIG. 11, the scattered light intensity map d(x,y) may represent an approximation of a difference between the measured image data (p(x,y)) indicated by the detection signals shown in FIG. 9A and the desired corrected image data i(x,y) shown in FIG. 9B:

$$d(x,y):=p(x,y)-i(x,y).$$

Solving for i(x,y) can be calculated by subtraction of the scattered light intensity map d(x,y) from the measured image data p(x,y) indicated by the detection signals:

$$i(x,y)=p(x,y)-d(x,y).$$

That is, acquisition or recovery of the scattered light intensity map d(x,y) allows for computation of the corrected image data i(x,y) by subtraction from the measured image data p(x,y). In some embodiments, the subtraction of the scattered light intensity map d(x,y) from the measured image data p(x,y) may be performed on a per frame or per subframe basis.

In some embodiments, the scattered light intensity map d(x,y) may correlate respective scatter intensities to the respective detector pixels, such that respective corrected signals can be generated based on a mathematical relationship (e.g., subtraction) of the respective scatter intensities and the respective detection signals output from the respective detector pixels that are correlated to the respective scatter intensities, i.e., on a pixel-by-pixel basis. For example, referring again to the phasor diagram of FIG. 7, based on information (phase $\theta_m$ and amplitude $|D_m|$) indicated by the detection signals (represented by the vector $D_{measured}$ 710) output from one or more pixels of the detector array in response to incident light along with the phase $\theta_{RR}$ and amplitude $|D_{RR}|$ information for the scattered light from a retroreflective target (represented by the vector $D_{retroreflector}$ 715), then the "true" or corrected signal (e.g., without the glare components; represented by vector $D_{target}$ 700) for the target can be recovered, for example, by vector subtraction. The information represented by the vector $D_{retroreflector}$ 715 thus defines a portion of an intensity map of scattered light (e.g., a respective scatter intensity and phase) for the one or more pixels from which the detection signal represented by the vector $D_{measured}$ 710 is output.

In some embodiments, subtraction as described herein may be considered with respect to "background offset" subtraction and "flare" subtraction. In background offset subtraction, the light pollution or background light level may be determined from measurement of a scalar input, that is, the "overall" intensity of the light input at one or more regions of the FoV (e.g., as highlighted by arrow 902 in FIG. 9A) other than the "flare" zone of a retroreflective target (highlighted by arrow 901 in in FIG. 9A). In some embodiments, the background offset level may be estimated as being substantially uniform across multiple regions of the FoV, and may be represented by a scattered light intensity map in which the respective scatter intensities are substantially uniform or non-spatially varying. Such subtraction may improve accuracy with respect to a majority of a scene or field of view that is outside the "flare" zone of the retroreflective target. Flare subtraction may include acquisition or generation of a spatially-varying scattered light intensity map, for example, based on intensities of brighter objects in the scene, referred to herein as a "bright object" intensity map or retroreflective target intensity map. The "flare" (or scattered light intensity map) may be calculated from the retroreflective target intensity map as discussed herein.

In some embodiments, background offset subtraction (e.g., based on a non-spatially varying intensity map) may be combined with operations for subtracting or dividing out expected spread functions (e.g., the calculated scattered light intensity map d(x,y) and/or the GSF g(x,y)) as described herein. For example, the background offset may be subtracted from the corrected image data i(x,y) generated as described with reference to FIG. 10 or 11 to provide further correction. As another example, the background offset data may be subtracted from the scattered light intensity map d(x,y) prior to generating the corrected image data i(x,y) based thereon.

In some embodiments, the expected spread function (e.g., the calculated scattered light intensity map d(x,y) and/or the GSF g(x,y)) may be used as a probability indicator for computing confidence in respective data points represented by the measured image data p(x,y). This probability map may be provided as an output by the control circuit or system, and/or may be used to further filter the measured image data p(x,y) to generate the corrected image data i(x,y). In some embodiments this probability map could be obtained by making estimates of the probability of data accuracy as a function of the relative intensity of the final, corrected value—i(x,y)—as compared to its original measured value, p(x,y). The higher the ratio of i(x,y)/p(x,y) the higher the confidence in the resulting range measurement.

FIG. 12 illustrates another example for generating corrected image data based on mathematical relationships (here, convolution and subtraction) between detection signals output from respective detector pixels and an expected spread function according to some embodiments of the present invention. In FIG. 12, a scattered light intensity map dd(x,y) is used as the expected spread function. As shown in FIG. 12, the scattered light intensity map dd(x,y) may represent an approximation of a difference between the measured image data (p(x,y)) indicated by the detection signals shown in FIG. 9A and the desired corrected image data i(x,y) shown in FIG. 9B.

However, in FIG. 12, the scattered light intensity map dd(x,y) is calculated by acquiring an intensity map representing only brighter targets in the FoV (e.g., retroreflectors), also referred to herein as a retroreflective target intensity map j(x,y). The retroreflective target intensity map j(x,y) may be a measure of intensities that correspond to objects at a distance or range that is equal to a distance or range of a retroreflective target in the field of view of the detector array. The scattered light intensity map dd(x,y) can be calculated by performing a convolution of the retroreflective target intensity map j(x,y) and the GSF g(x,y), and subtracting the retroreflective target intensity map j(x,y) from the result of the convolution q(x,y):

$$q(x,y)=\mathrm{CONV}(j(x,y),g(x,y))$$

$$dd(x,y)=q(x,y)-j(x,y).$$

As shown in FIG. 12, the approximation of the scattered light intensity map dd(x,y) is similar to the scattered light intensity map d(x,y) of FIG. 11. Solving for i(x,y) can be calculated by subtraction of the scattered light intensity map dd(x,y) from the measured image data p(x,y) indicated by the detection signals to provide the corrected image data:

$$i(x,y)=p(x,y)-dd(x,y).$$

In some embodiments, the retroreflective target intensity map, j(x,y), may be generated based on outputs from the detector pixels for an acquisition subframe of shorter duration than that of the measurement subframes used to generate the respective detection signals. That is, information as to the light contributions from retroreflective targets in the FoV may be obtained by operating a subset (or all) of the detector pixels of the detector array using shorter integration times (in comparison to the integration times that are used to generate the detection signals of a measurement subframe) to generate retroreflector-specific detection signals. This acquisition subframe may be implemented by controlling the detector pixels to capture an extra subframe (in addition to the measurement subframes used to generate the respective detection signals) for one or more image frames. For example, the detector pixels of the detector array may be operated with "ultra-short" (e.g., on the order of single nanoseconds up to one or more microseconds, rather than longer integration times of many tens to thousands of microseconds) integration times to implement acquisition subframes at the beginning or at the end of a high dynamic range (HDR) measurement that utilizes multiple subframes with different (e.g. alternating longer and shorter) integration times. As the more intense portions of the echo signals from retroreflective targets may contribute more meaningfully to the pollution light, the signals output from the detector pixels for the short integration time exposure provide an approximation or estimation of the respective intensities of a portion or subset of the light that is reflected from the retroreflective target(s) over the FoV.

As shown in FIG. 12, the retroreflective target intensity map j(x,y) represents the peak values of the measured HDR data p(x,y), effectively discarding the light from moderately bright targets in the FoV. That is, the detector array may be operated to capture light from the FoV for a relatively short integration time such that the resulting outputs of the detector pixels effectively return only the peak values of the measured HDR data p(x,y) to include in the retroreflective target intensity map j(x,y). The retroreflective target intensity map j(x,y) may thus distinguish light returned from retroreflectors from light returned from other objects in the field. The duration of the short integration time acquisition subframe can avoid saturation of the detector pixels by the brighter targets in the FoV, while the longer integration time measurement subframes allow for detection signals representing the full dynamic range of the detector pixels and/or associated circuits.

In some embodiments, the short integration time acquisition subframe may be used to calculate the value of the amplitude or intensity of the scattered light on a pixel-by-pixel basis. The phase can be calculated by several methods, including but not limited to the measured phase of non-saturated detector pixels that are adjacent or near the detector pixel(s) that are positioned to image the retroreflector. For example, referring again to FIG. 7, the phase $\theta_{RR}$ together with the intensity $|D_{RR}|$ defines the vector $D_{retroreflector}$ 715, which can be subtracted from the measured vector $D_{measured}$ 710 (for each pixel) to recover the "true" or corrected signal, represented by vector $D_{target}$ 700 (for each pixel).

In the case of retro-reflector induced glare, the phase $\theta_{RR}$ of the light pollution may be more easily recovered or determined, but the assignment or correlation of the intensity $|D_{RR}|$ of the light pollution to respective detector pixels of the detector array (e.g., to each of 100,000+ detector pixels) may be more difficult. Some embodiments described herein may utilize the short integration time acquisition subframe to measure respective return signal intensities indicated by the respective outputs from one or more (or every) detector pixel, to provide the retroreflective target light intensity map with respective intensities correlated to the respective detector pixels of the detector array. The duration of the short integration time captures a subset of the scattered light, that is, contributions from objects at a distance or range that is equal to that of one or more retroreflective targets in the FoV.

Some embodiments described herein can thus assign the retroreflective target intensity map to respective detector pixels of the detector array (i.e., on a pixel-by-pixel basis), and use the retroreflective target intensity map to subtract background from the respective detection signals output from the detector pixels to provide respective corrected signals. In particular, the retroreflective target intensity map of pollution light from extremely bright objects can be predicted or determined by measurement as described herein, and can be combined with the GSF for the optical system (e.g., as discussed above with reference to FIG. 12) to approximate or estimate the scattered light intensity map, which can be used to subtract pollution components from the respective detection signals on a pixel-by-pixel basis to provide corrected data as respective corrected signals. Embodiments described herein can thereby utilize an intensity (and phase) map that corresponds to retroreflectors in the field of view to correct biased measurements from detector pixels that detect echo signals from or are otherwise positioned to image dimmer objects in the field of view.

Further embodiments described herein are directed to operations performed by one or more detector control circuits (such as the control circuit 105 and/or timing circuit 106) for time-gating the integration of echo signals so as to effectively exclude retroreflective target intensity data from the detection signals output from the detector pixels of the detector array. In particular, one (or more) short (e.g., single nanosecond) time gates or windows may be added onto the integration waveform of the control signals provided to the detector pixels, where the short time gates or windows correspond to a range of one or more retroreflective targets in the FoV. For example, the range of the retroreflective target(s) may be determined by the detector control circuit(s) from a previous measurement frame or subframe. The detector control circuit(s) may thereby generate detector control signals and/or timing signals that control the operation of the respective detector pixels such that, during the short time gates or windows, the integration of photocharge by one or more detector pixels are turned off, shunted to ground, or otherwise omitted. For example, where the detector pixel is implemented as an avalanche photodiode (APD) or a SPAD, the "gain" of the photodiode could be set to 0 to eliminate the photoresponse.

That is, the detector control signals are configured to prevent or exclude integration by a subset of the detector pixels during a measurement subframe or time slot corresponding to the range of the at least one retroreflective target. More generally, one or more detector pixels may be turned off (or the integration thereby may be turned off) for brief periods and/or times corresponding to a range of one or more retroreflective targets, based on the range determined from echo signals returned by one or more retroreflective targets (e.g., as detected in a previous measurement subframe). This can allow rejection of excess light from retroreflective targets that originates from a specific distance range, based on the predetermined knowledge or information regarding the locations and/or distance ranges of the retroreflectors. As such, measurements by a subset of the detector pixels during periods and/or times corresponding to the range of the retroreflective target(s) (e.g., detection during a range-specific subframe, which may be of a shorter duration than the measurement subframes in some embodiments) may be discarded such that the resulting corrected detection signals are free of the retroreflective target intensity data, without performing subtraction of the retroreflective target intensity map or other correction operations described herein at the controller or control circuit. That is, by excluding retroreflective target intensity data at the detector- or camera-level, the control circuit (e.g. 105) may receive already-corrected detection signals representing stray light-corrected image data from the detector array (e.g., 110), allowing for calculation of distance ranges with increased accuracy and reduced processing requirements.

Embodiments described herein may thus allow for generation of image data with greater tolerance of very bright objects in a scene, allowing relatively dim targets to be more accurately ranged. Some detailed examples of mechanisms by which light pollution from retroreflectors can bias and generate error in the measurement of targets at other field points are provided below.

Retroreflectors can saturate detector pixels that are arranged to directly image the retroreflectors because their return/echo signal may be sufficiently strong (in intensity) so as to fill out the maximum dynamic range of the analog-to-digital converter (ADC) coupled to the detector pixel(s), and/or saturate the full well capacity of the detector pixel wells (photocharge collectors). The strong return signals from a retroreflector can cause secondary light scattering that redirects signal photons reflected from the retroreflector onto detector pixels that do not correspond to imaging that section of space (e.g., other pixel locations on the detector array).

While all photons entering the imaging system may have a chance of scattering, the raw (e.g., unprocessed) signal strength or intensity of photons reflected from retroreflectors (and/or extremely close objects) may be such that the amount of scattered light can overwhelm relatively dim objects imaged by other detector pixels of the detector array (e.g., detector pixels adjacent the detector pixel(s) that are arranged to image to a portion of the field of view in which the retroreflector is located). While a retroreflector at a greater distance range (e.g., about 55 meters or more) may not return enough light to cause significant secondary scattering to other pixels, secondary scattering may be problematic for relatively close retroreflectors, such as retroreflectors within about 10 meters or less from the detector array.

Figure 13:
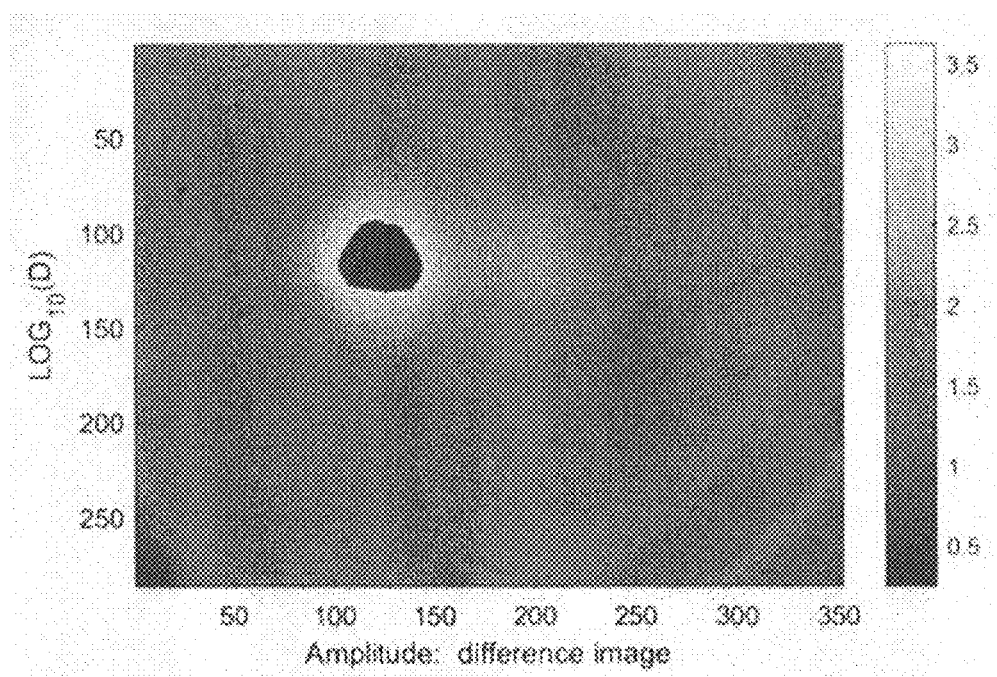
FIG. 13 is an image illustrating effects of a retroreflector in the field of view in detection operations according to some embodiments of the present invention.

The secondary scattered light from the retroreflector can result in detection signals that (inaccurately) indicate a shift in the range of dimmer objects in the field of view. FIG. 13 is an amplitude-difference image illustrating effects of a retroreflector in the field of view in detection operations according to embodiments of the present invention. As shown in FIG. 13, when measuring first and second scenes that differ only by the presence of a retroreflector in the field of view of the second scene, systematic distortions may be present in the range measurements of the second scene including the retroreflector.

Additionally, corresponding phase background may be present when analyzing differences between before and after raw phase component image data. For a system with a relatively short unambiguous range, this (e.g., the phase background) may be used to detect pixels that are "contaminated" by a signal from a retroreflector that is located outside of the unambiguous range. Operation of lidar systems as described herein may address light scattering caused by retroreflectors that are within the unambiguous range (rather than outside of the unambiguous range).

FIGS. 14A-14D are images of a field of view illustrating phase component differences (in particular, the additional phase background that may be added) when a retroreflector is placed in a scene. FIGS. 14A and 14B illustrate the additional phase background detected in D0,D2 subframes and D1,D3 subframes, respectively, for a 21 MHz modulation signal, while FIGS. 14C and 14D illustrate the additional phase background detected in D0,D2 subframes and D1,D3 subframes, respectively, for a 18 MHz modulation signal. In FIGS. 14A-14D, each of the images include bright primary phase spots 10 that are associated with the actual or true location of the retroreflectors, secondary spots 20 that are not directly from a retroreflector location (but may be based on lens flare from the retroreflector), and regular and/or uniform phase background in regions separated or more distant from the retroreflectors (e.g., regions other than the primary 10 and secondary 20 spots). The regular and/or uniform phase background appears to be directionally correlated with the primary phase spot 10 (positive or negative). The primary phase spot 10, the secondary phase spot 20, and the dim phase background may all be correlated since they may all include light reflected from the retroreflector, but redirected to different locations of the detector array.

Retroreflectors can appear to be hundreds to thousands of times brighter than typical scene objects, and may therefore cause detector pixel saturation when imaged. As noted above, while images of these objects may be used to estimate phase background, highly saturated images may negatively affect accuracy. For example, with highly saturated images, obtaining the necessary information to estimate the phase background may be difficult due to inability and/or difficulty to accurately gauge the full intensity of the objects (e.g., the illumination of the objects). Some methods for removing saturation effects may involve throwing out points expected to be affected, which may reduce the overall number of incorrect points, with a side effect of eliminating points from dimmer objects. These methods may merely reduce bad data, but may not produce more correct data.

Embodiments described herein may thus provide phase background correction methods that use image information (as detected from reflected light emission over the FoV) that is non-saturated to address and/or overcome difficulties in estimating the background. Non-limiting examples of images used by some embodiments of the present invention include an image detected on a first detector array or chip but captured at shorter integration times (in comparison to the integration times of subframes that are used to generate the detection signals for the first detector array). The shorter integration times may be provided before and/or after the integration times that are used to generate the detection signals for the first detector array. Such detector operations may be performed, for example, based on detector control signals generated by the control circuit 105 and/or timing signals generated by the timing circuit 106 of FIG. 1. Additionally or alternatively, non-saturated images may be detected on a second detector array or chip, with optical filtering being used to capture the images at the same time as the first detector array or chip.

Some embodiments described herein for reducing phase error may include: the use of lenses that reduce optical scattering (e.g., physical changes to the system); methods which find a uniform estimate of the phase background and subtract the uniform estimate from the image information;

and methods which determine an estimate of the spatial variation of the phase background, and subtract that estimate from the image information.

For example, some embodiments of the present invention may include methods of reducing phase background based on an assumption of a substantially uniform level of phase background over the FoV, which may be present in detection signals output from multiple (e.g., all) detector pixels of a detector array. That is, light scattered by the lens or optical system may be assumed to be distributed uniformly to all detector pixels. The phase background may be assumed to be proportional to the incident light entering the lens, and may be weighted by the phase of the incident light. In some embodiments, a scattered light intensity map with substantially uniform scatter intensities may be generated to approximate the uniform phase background.

In some embodiments, measuring or determining the uniform phase background may include acquiring image data using a shorter integration time (e.g., as a background-specific acquisition subframe before or after the integration times of the measurement subframes used for generating the detection signals), generating a weighted value based on the image data, and subtracting the weighted value from the respective detection signals output from the detector pixels. In some embodiments, the weighted value may be a function of the sum or average of the information captured in the background-specific acquisition subframe for multiple (or all) detector pixels, that is a function of the sum or average of the background-specific detection signals. In some embodiments, a threshold may be applied to the weighted value, to remove or discard information (e.g., lower values) that may stem from noise. In some embodiments, the weighted value may be spatially weighted, such that background-specific detection signals output from detector pixels at some regions of the detector array may add more to the weighted value than others. In some embodiments, the weighted value may differ for different modulation frequencies or optical pulse shapes.

Each measurement frame may be assembled from multiple separate subframes, with each subframe representing a separate measurement. The subframes may be referred to as differential images, or D images. Once the weight is calculated, it can be multiplied by a scale factor then subtracted from the respective detection signals output from multiple (or all) detector pixels for a particular D image to generate a corrected D-image, providing a corrected version of the raw D-image represented by the detection signals.

Figure 15A:
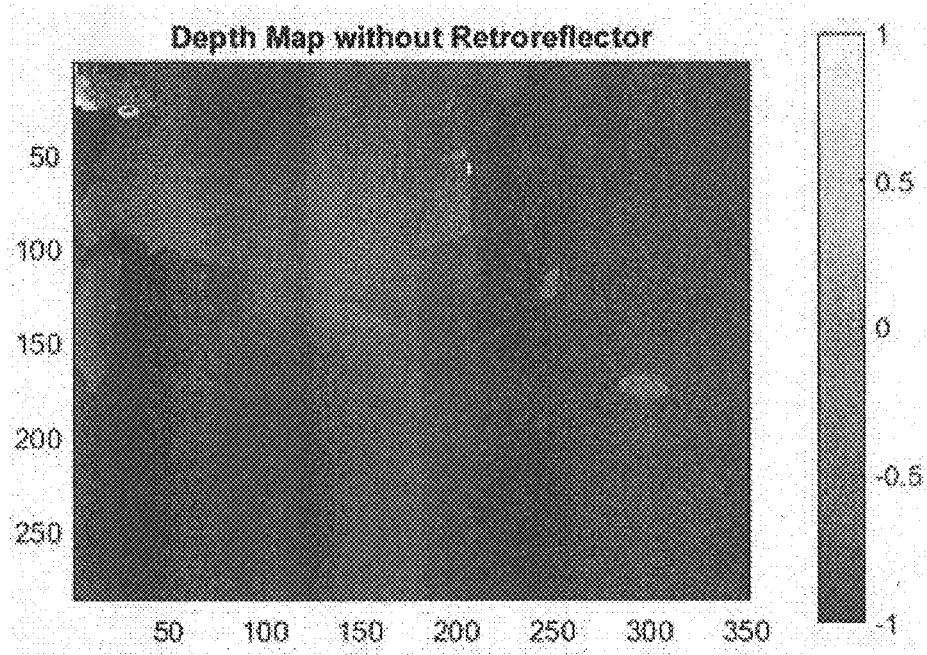

Subtraction of uniform phase background in accordance with embodiments of the present invention may result in reduced errors in range estimation, as shown in FIGS. 15A-15E. In particular, FIG. 15A illustrates an image detected in a scene without a retroreflector; FIG. 15B illustrates an image detected in the same scene with a retroreflector present, and FIG. 15C illustrates a corrected image responsive to uniform phase background subtraction operations as described herein. FIG. 15D illustrates a differential image between the images of FIGS. 15A and 15B (illustrating the additional phase background added by the presence of the retroreflector), and FIG. 15E illustrates a corrected differential image responsive to uniform phase background subtraction operations as described herein.

In addition, further embodiments of the present invention may include methods of reducing background by calculating spatially-varying effects of scattered light. In some embodiments, a per-pixel scattering function may be measured and/or estimated by correlating strong or peak intensities (measured by operating one or more detector pixels using short integration times, as discussed above) to a spatially varying background for multiple other detector pixels that are operated using a longer integration time. The correlation of the measured intensities from the subset of detector pixels operated with the short integration time to respective detector pixels of the detector array creates a spatially varying subtraction image (e.g., a scattered light intensity map with respective scatter intensities correlated to respective detector pixels), which may be used to subtract spatially varying terms (such as bloom and lens flare) from the detection signals output from the respective correlated detector pixels. Subtracting the spatially varying background terms may allow for the recovery of the correct phase on a per-pixel basis. In some embodiments, subtracting the spatially varying background may be performed by treating the array of detector pixels as a vector, generating a transfer matrix that indicates how the background or scattered light is distributed to all detector pixels from a given detector pixel (e.g., based on an expected spread function, such as the GSF described herein), and performing a matrix multiply to construct the spatially varying background vector.

As also discussed above, particular embodiments of the present invention may be directed to data processing based on real-time estimation of non-uniform phase background or cross-talk, e.g., as indicated by an expected spread function as described herein. For example, a detector control circuit (such as the control circuit 105 and/or timing circuit 106) may operate one or more detector pixels of the detector array to alternate between short and long integration times in each measurement frame. This operation may differ from a HDR integration mode used in some indirect ToF systems (whereby subsets of detector pixels may be operated with longer integration times to capture as much high-reflectance phase information from dimmer objects, and with shorter integration times to capture as much high-reflectance phase information from bright objects).

For example, as discussed above with reference to FIG. 12, in some embodiments the short integration time may be selected such that echo signals from pixel-saturating targets (e.g., retroreflective targets reflecting pixel-saturating light) are captured, rather than echo signals from moderately bright objects (e.g., objects reflecting moderately bright light). In some embodiments, a characteristic cross-talk spread function (e.g., a GSF) may be derived for the optical system, and for an isolated retroreflective target, the pattern of light captured by a subset or all detector pixels in a detector array may be determined and/or estimated (e.g., a retroreflective target intensity map). When such a retroreflective target is detected in a short-integration time subframe, the system may calculate an expected spread function (e.g., a scattered light intensity map) for the long-integration time subframe, and this spread function may be subtracted from the raw frames or detection signals captured by the detector pixels. Such subtraction of non-uniform phase background may be used to improve the phase estimate (and therefore the range estimate) of other objects (i.e., other than the retroreflective target) in the field of view.

Embodiments of the present invention thereby provide various methods of background correction and related LIDAR detector arrays and control circuits. Some embodiments of the present invention include calculating an aggregate or uniform background estimate to be subtracted from the detection signals output from multiple (or all) detector pixels to generate corrected image data. Some embodiments of the present invention include creating a non-uniform or spatially varying background estimate to subtract from the detection signals (or the raw image data represented thereby), in some instances on a per-pixel basis, to generate corrected image data. Some embodiments of the present invention include determining a glare spread function and generating corrected image data based on a mathematical combination of the detection signals (or the raw image data represented thereby) with the glare spread function. Some embodiments of the present invention include determining a range of one or more retroreflective targets in the field of view and preventing (or discarding results of) integration by the detector pixels for measurement subframe(s) corresponding to the determined range of the retroreflective target(s), without performing additional computational operations described herein.

In some embodiments, measuring ranges of targets over a distance range may be accomplished by acquiring data for multiple subframes, which may be used to compute multiple (e.g., two) phases corresponding to two different unambiguous ranges. The combination of two phases at shorter unambiguous ranges may allow for the computation of greater distances. That is, distance may be determined by analyzing respective signals at multiple (e.g., two) separate phases, and, each phase may be calculated from multiple measurements. The measurements may in some instances indicate the presence of targets within the unambiguous range that are in actuality outside of the unambiguous range. For example, range measurements of objects that are located at a range of 60 meters may be detected at a range of 10 meters. While an encoded modulation scheme could be used to correct this, alternatively, measurements could be performed at a third frequency. For example, in addition to modulation at first and second frequencies (e.g., two frequencies between 15 to 50 MHz, with a 10 MHz or less difference therebetween), data may also be measured at a third frequency (e.g., within the 10 MHz or less difference between the first and second frequencies), which may allow for an increase in the distance range (at least well enough to determine the presence of unambiguous range issues). In some embodiments, this may be accomplished with the addition of only a few (e.g., two) additional frames/subframes.

Lidar systems and arrays described herein may be applied to ADAS (Advanced Driver Assistance Systems), autonomous vehicles, UAVs (unmanned aerial vehicles), industrial automation, robotics, biometrics, modeling, augmented and virtual reality, 3D mapping, and security. In some embodiments, the emitter elements of the emitter array may be vertical cavity surface emitting lasers (VCSELs). In some embodiments, the emitter array may include a non-native substrate having thousands of discrete emitter elements electrically connected in series and/or parallel thereon, with the driver circuit implemented by driver transistors integrated on the non-native substrate adjacent respective rows and/or columns of the emitter array, as described for example in U.S. Patent Application Publication No. 2018/0301872 to Burroughs et al., filed Apr. 12, 2018, with the United States Patent and Trademark Office, the disclosure of which is incorporated by reference herein.

Various embodiments have been described herein with reference to the accompanying drawings in which example embodiments are shown. These embodiments may, however, be embodied in different forms and should not be construed as limited to the embodiments set forth herein. Rather, these embodiments are provided so that this disclosure is thorough and complete and fully conveys the inventive concept to those skilled in the art. Various modifications to the example embodiments and the generic principles and features described herein will be readily apparent. In the drawings, the sizes and relative sizes of layers and regions are not shown to scale, and in some instances may be exaggerated for clarity.

The example embodiments are mainly described in terms of particular methods and devices provided in particular implementations. However, the methods and devices may operate effectively in other implementations. Phrases such as "some embodiments," "one embodiment," and "another embodiment" may refer to the same or different embodiments as well as to multiple embodiments. The embodiments will be described with respect to systems and/or devices having certain components. However, the systems and/or devices may include fewer or additional components than those shown, and variations in the arrangement and type of the components may be made without departing from the scope of the inventive concepts. The example embodiments will also be described in the context of particular methods having certain steps or operations. However, the methods and devices may operate effectively for other methods having different and/or additional steps/operations and steps/operations in different orders that are not inconsistent with the example embodiments. Thus, the present inventive concepts are not intended to be limited to the embodiments shown, but are to be accorded the widest scope consistent with the principles and features described herein.

It will be understood that when an element is referred to or illustrated as being "on," "connected," or "coupled" to another element, it can be directly on, connected, or coupled to the other element, or intervening elements may be present. In contrast, when an element is referred to as being "directly on," "directly connected," or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a," "an," and "the" are intended to include the plural forms as well, unless the context clearly indicates otherwise.

It will also be understood that the term "and/or" as used herein refers to and encompasses any and all possible combinations of one or more of the associated listed items.

It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to illustrations that are schematic illustrations of idealized embodiments (and intermediate structures) of the invention. As such, variations from the shapes of the illustrations as a result, for example, of manufacturing techniques and/or tolerances, are to be expected. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entireties.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments of the present invention described herein, and of the manner and process of making and using them, and shall support claims to any such combination or subcombination.

Although the invention has been described herein with reference to various embodiments, it will be appreciated that further variations and modifications may be made within the scope and spirit of the principles of the invention. Although specific terms are employed, they are used in a generic and descriptive sense only and not for purposes of limitation, the scope of the present invention being set forth in the following claims.

The invention claimed is:

1. A Light Detection and Ranging (LIDAR) apparatus, comprising:
   one or more optical elements configured to direct incident light in one or more directions;
   a detector array comprising a plurality of detector pixels configured to output detection signals responsive to light provided thereto by the one or more optical elements, wherein the light comprises scattered light that is redirected relative to the one or more directions; and
   a circuit configured to receive the detection signals and generate corrected image data based on the detection signals and an expected spread function for the light, wherein the expected spread function comprises a scattered light intensity map comprising respective scatter intensities of the scattered light over a field of view of the detector array, and wherein the circuit is configured to generate the corrected image data based on subtraction of the scattered light intensity map from image data represented by the detection signals.

2. The LIDAR apparatus of claim 1, wherein the expected spread function is based on a glare spread function for the one or more optical elements.

3. The LIDAR apparatus of claim 2, wherein the circuit is configured to detect distribution of light emission from a point light source to the plurality of detector pixels by the one or more optical elements, and is configured to generate the glare spread function based on the distribution.

4. The LIDAR apparatus of claim 1, wherein the respective scatter intensities are substantially uniform over the field of view.

5. The LIDAR apparatus of claim 1, wherein the respective scatter intensities are spatially-varying over the field of view.

6. The LIDAR apparatus of claim 1, wherein the detection signals represent the light detected by the detector pixels for a respective measurement subframe, and wherein the circuit is configured to generate the scattered light intensity map based on outputs from a subset of the detector pixels for an acquisition subframe of a shorter duration than that of the measurement subframe.

7. The LIDAR apparatus of claim 6, wherein the outputs from the subset of the detector pixels define a retroreflective target intensity map comprising respective intensities of a subset of the light reflected from at least one retroreflective target in the field of view, and wherein the circuit is configured to generate the scattered light intensity map by combining the retroreflective target intensity map with a glare spread function for the one or more optical elements.

8. The LIDAR apparatus of claim 1, wherein the circuit is configured to correlate the respective scatter intensities to respective detector pixels of the plurality of detector pixels, and wherein the subtraction comprises pixel-by-pixel subtraction of the respective scatter intensities from respective detection signals output from the respective detector pixels correlated thereto.

9. The LIDAR apparatus of claim 1, wherein the circuit is configured to determine a distance range of a target in a field of view of the detector array based on the corrected image data, and wherein the LIDAR apparatus is configured to be coupled to a vehicle and oriented with the field of view of the detector array comprising an intended direction of travel of the vehicle.

10. A method of operating a Light Detection and Ranging (LIDAR) apparatus, the method comprising:
   performing, by a circuit of the LIDAR apparatus, operations comprising:
   receiving detection signals output from detector pixels of a detector array responsive to light provided thereto by one or more optical elements configured to direct incident light in one or more directions, wherein the light comprises scattered light that is redirected relative to the one or more directions; and
   generating corrected image data based on the detection signals and an expected spread function for the light, wherein the expected spread function comprises a scattered light intensity map comprising respective scatter intensities of the scattered light over a field of view of the detector array, and wherein generating the corrected image data is based on subtraction of the scattered light intensity map from image data represented by the detection signals.

11. The method of claim 10, wherein the expected spread function is based on a glare spread function for the one or more optical elements.

12. The method of claim 11, wherein the glare spread function indicates distribution of light emission from a point light source to a plurality of the detector pixels by the one or more optical elements.

13. The method of claim 10, wherein the respective scatter intensities are substantially uniform over the field of view.

14. The method of claim 10, wherein the respective scatter intensities are spatially-varying over the field of view.

15. The method of claim 10, wherein the detection signals represent the light detected by the detector pixels for a respective measurement subframe, and wherein the operations further comprise:
    generating the scattered light intensity map based on outputs from a subset of the detector pixels for an acquisition subframe of a shorter duration than that of the measurement subframe.

16. The method of claim 15, wherein the outputs from the subset of the detector pixels define a retroreflective target intensity map comprising respective intensities of a subset of the light reflected from at least one retroreflective target in the field of view, and wherein generating the scattered light intensity map comprises:
    combining the retroreflective target intensity map with a glare spread function for the one or more optical elements.

17. A Light Detection and Ranging (LIDAR) apparatus, comprising:
    one or more optical elements configured to direct incident light in one or more directions;
    a detector array comprising a plurality of detector pixels configured to output detection signals responsive to light provided thereto by the one or more optical elements, wherein the light comprises scattered light that is redirected relative to the one or more directions; and; and
    a circuit configured to determine a distance range of at least one retroreflective target in a field of view of the detector array, generate detector control signals based on the distance range of the at least one retroreflective target, and generate corrected image data based on the detection signals responsive to determining the distance range of the at least one retroreflective target.

18. The LIDAR apparatus of claim 17, wherein the detector pixels are configured to output the detection signals so as to omit a subset of the light corresponding to the distance range of the at least one retroreflective target responsive to the detector control signals.

19. The LIDAR apparatus of claim 18, wherein the detector control signals comprise time slots corresponding to respective distance ranges, wherein the detector pixels are configured to exclude integration of photocharges during one of the time slots corresponding to the distance range of the at least one retroreflective target.

* * * * *